(12) United States Patent
Lin et al.

(10) Patent No.: US 12,477,764 B2
(45) Date of Patent: Nov. 18, 2025

(54) METHOD OF MANUFACTURING A SOURCE/DRAIN OF A SEMICONDUCTOR DEVICE USING MULTIPLE IMPLANTATION PROCESSES

(71) Applicant: Taiwan Semiconductor Manufacturing Co., Ltd., Hsinchu (TW)

(72) Inventors: Yu-Chang Lin, Hsinchu (TW); Liang-Yin Chen, Hsinchu (TW); Chun-Feng Nieh, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 558 days.

(21) Appl. No.: 17/529,394

(22) Filed: Nov. 18, 2021

(65) Prior Publication Data

US 2022/0367686 A1 Nov. 17, 2022

Related U.S. Application Data

(60) Provisional application No. 63/188,145, filed on May 13, 2021.

(51) Int. Cl.
*H10D 30/01* (2025.01)
*H01L 21/265* (2006.01)
(Continued)

(52) U.S. Cl.
CPC ..... *H10D 30/024* (2025.01); *H01L 21/26513* (2013.01); *H01L 21/324* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 8,962,400 B2 | 2/2015 | Tsai et al. |
| 9,093,514 B2 | 7/2015 | Tsai et al. |

(Continued)

FOREIGN PATENT DOCUMENTS

TW I517256 B 1/2016

*Primary Examiner* — Younes Boulghassoul
(74) *Attorney, Agent, or Firm* — Slater Matsil, LLP

(57) ABSTRACT

A semiconductor device and a method of forming the same are provided. The method includes forming a semiconductor fin extending from a substrate. A dummy gate stack is formed over the semiconductor fin. The dummy gate stack extends along sidewalls and a top surface of the semiconductor fin. The semiconductor fin is patterned to form a recess in the semiconductor fin. A semiconductor material is deposited in the recess. An implantation process is performed on the semiconductor material. The implantation process includes implanting first implants into the semiconductor material and implanting second implants into the semiconductor material. The first implants have a first implantation energy. The second implants have a second implantation energy different from the first implantation energy.

20 Claims, 42 Drawing Sheets

(51) Int. Cl.
  *H01L 21/324* (2006.01)
  *H10D 30/62* (2025.01)
  *H10D 62/13* (2025.01)
  *H10D 84/01* (2025.01)
  *H10D 84/03* (2025.01)

(52) U.S. Cl.
  CPC ....... *H10D 30/6211* (2025.01); *H10D 62/151* (2025.01); *H10D 84/0158* (2025.01); *H10D 84/017* (2025.01); *H10D 84/038* (2025.01)

(58) Field of Classification Search
  CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 21/823418; H01L 21/823814; H01L 21/823425; H01L 29/0847; H01L 29/7848; H01L 29/66636; H01L 29/66575; H01L 29/41783; H01L 21/265; H01L 21/26506; H01L 21/26513; H01L 21/2652; H01L 21/26586; H01L 21/26593; H01L 21/266; H01L 21/423; H01L 21/425; H01L 21/02694; H10B 12/36; H10B 12/056; H10D 84/0158; H10D 84/0193; H10D 84/834; H10D 84/853; H10D 86/011; H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 62/151; H10D 62/021; H10D 84/013; H10D 84/0133; H10D 84/017; H10D 30/6713; H10D 30/0223; H10D 30/797; H10D 30/601; H10D 30/605; H10D 30/6715; H10D 30/0218; H10D 30/022; H10D 30/6719; H10D 30/6721; H10D 30/0227

See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2011/0171795 | A1 | 7/2011 | Tsai et al. |
| 2015/0206946 | A1* | 7/2015 | Chen .................. H01L 29/0847 438/300 |
| 2016/0365414 | A1 | 12/2016 | Peng et al. |
| 2017/0194321 | A1* | 7/2017 | Yeong ................ H01L 21/2236 |
| 2017/0222051 | A1* | 8/2017 | Tsai .................... H01L 29/7834 |
| 2018/0076326 | A1* | 3/2018 | Roh .................... H01L 21/26513 |
| 2019/0131399 | A1* | 5/2019 | Liu .................... H01L 21/02532 |
| 2019/0165124 | A1* | 5/2019 | More ................... H01L 29/165 |
| 2020/0006545 | A1* | 1/2020 | Liu .................... H01L 21/76829 |
| 2020/0044025 | A1* | 2/2020 | Liu .................... H01L 29/66545 |
| 2020/0381516 | A1* | 12/2020 | Zhaomeng ........ H01L 29/41791 |
| 2021/0119022 | A1* | 4/2021 | Lee .................... H01L 29/0847 |
| 2021/0375687 | A1* | 12/2021 | Lin ...................... H01L 29/785 |

* cited by examiner

|      | #1 | #2 | #3 | #4 | #5 | #6 | #7 | #8 | #9 | #10 |
|------|----|----|----|----|----|----|----|----|----|-----|
| IMP1 | As | P  | As | As | As | P  | P  | As | P  | P   |
| IMP2 | As | P  | As | P  | P  | P  | As | As | P  | As  |
| IMP3 |    |    | P  |    | P  | As |    | As | P  | Sb  |

Figure 17

METHOD OF MANUFACTURING A SOURCE/DRAIN OF A SEMICONDUCTOR DEVICE USING MULTIPLE IMPLANTATION PROCESSES

PRIORITY CLAIM AND CROSS-REFERENCE

This application claims the benefit of U.S. Provisional Application No. 63/188,145, filed on May 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 is a table illustrating implants for first, second and third implantation processes in accordance with some embodiments.

DETAILED DESCRIPTION

Figure 1:
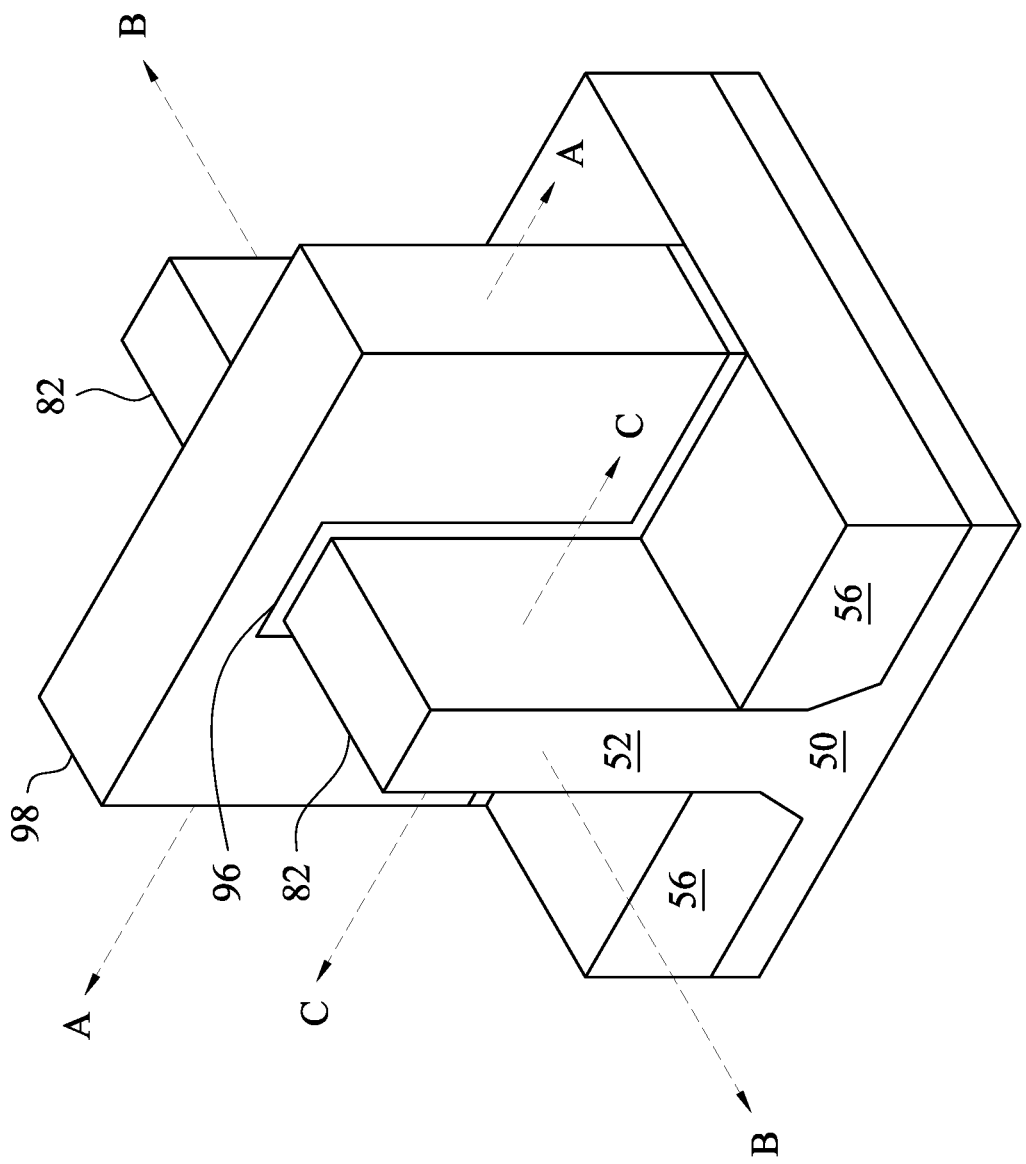
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a source/drain structure of a semiconductor device and a method of forming the same. Various embodiments presented herein are discussed in the context of a FinFET device formed using a gate-last process. In other embodiments, a gate-first process may be used. Various embodiments may also be applied to dies comprising other types of transistors (e.g., planar transistors, gate-all-around (GAA) transistors, nanostructure (e.g., nanosheet, nanowire, or the like) transistors, or the like) in lieu of or in combination with the FinFETs. Various embodiments discussed herein allow for forming a source/drain region by epitaxially growing a suitable semiconductor material and doping the epitaxially grown semiconductor material with suitable dopants using a high energy/low dose implantation process. The high energy/low dose implantation process may include one or more implantation processes. In various embodiments, the high energy/low dose implantation process allows for reducing a channel resistance ($R_{ch}$) and a parasitic resistance ($R_p$) of a semiconductor device, reducing formation of P4V clusters (such as vacancies surrounded by 4 nearest-neighbor phosphorus atoms) in the source/drain regions for higher dopant activation and less dopant diffusion, forming deep diffusion-less pn junctions between source/drain regions and respective channel regions, providing desired dopant activation for device performance requirement, shortening an effective channel length and keeping lower drain-induced barrier lowering (DIBL). In various embodiments, the high energy/low dose implantation process further allows for accurate and controllable definition of deep diffusion-less pn junctions between source/drain regions and respective channel regions, and allows for modulating dopant profiles of diffusion-less pn junctions.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 96 is along sidewalls and over a top surface of the fin 52, and a gate electrode 98 is over the gate dielectric layer 96. Source/drain regions 82 are disposed in opposite sides of the fin 52 with respect to the gate dielectric layer 96 and the gate electrode 98. FIG. 1 further illustrates reference cross-sections that are used in later figures. Cross-section A-A is along a longitudinal axis of the gate electrode 98 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 11A, 11B, 12A, 12B, 13A, 13B, 14A, 14B, 15A, 15B, 16A, 16B, 18A, 18B, 18C, 18D, 18E, 18F, 19A, 19B, 20A, 20B, 21A, 21B, 22A, 22B, 22C, 23A, 23B, 24A, and 24B are cross-sectional views of intermediate stages in the manufacturing of a FinFET device in accordance with some embodiments. FIGS. 2 through 7 illustrate cross-sectional views along the reference cross-section A-A illustrated in FIG. 1, except for multiple fins/FinFETs. FIGS. 8A-16A, and 18A-24A are illustrated along the reference cross-section A-A illustrated in FIG. 1. FIGS. 8B-16B, 18B-22B, 22C, 23B, and 24B are illustrated along the reference cross-section B-B illustrated in FIG. 1, except for multiple fins/FinFETs. FIGS. 18C, 18D, 18E, and 18F are illustrated along the reference cross-section C-C illustrated in FIG. 1, except for multiple fins/FinFETs.

Figure 2:
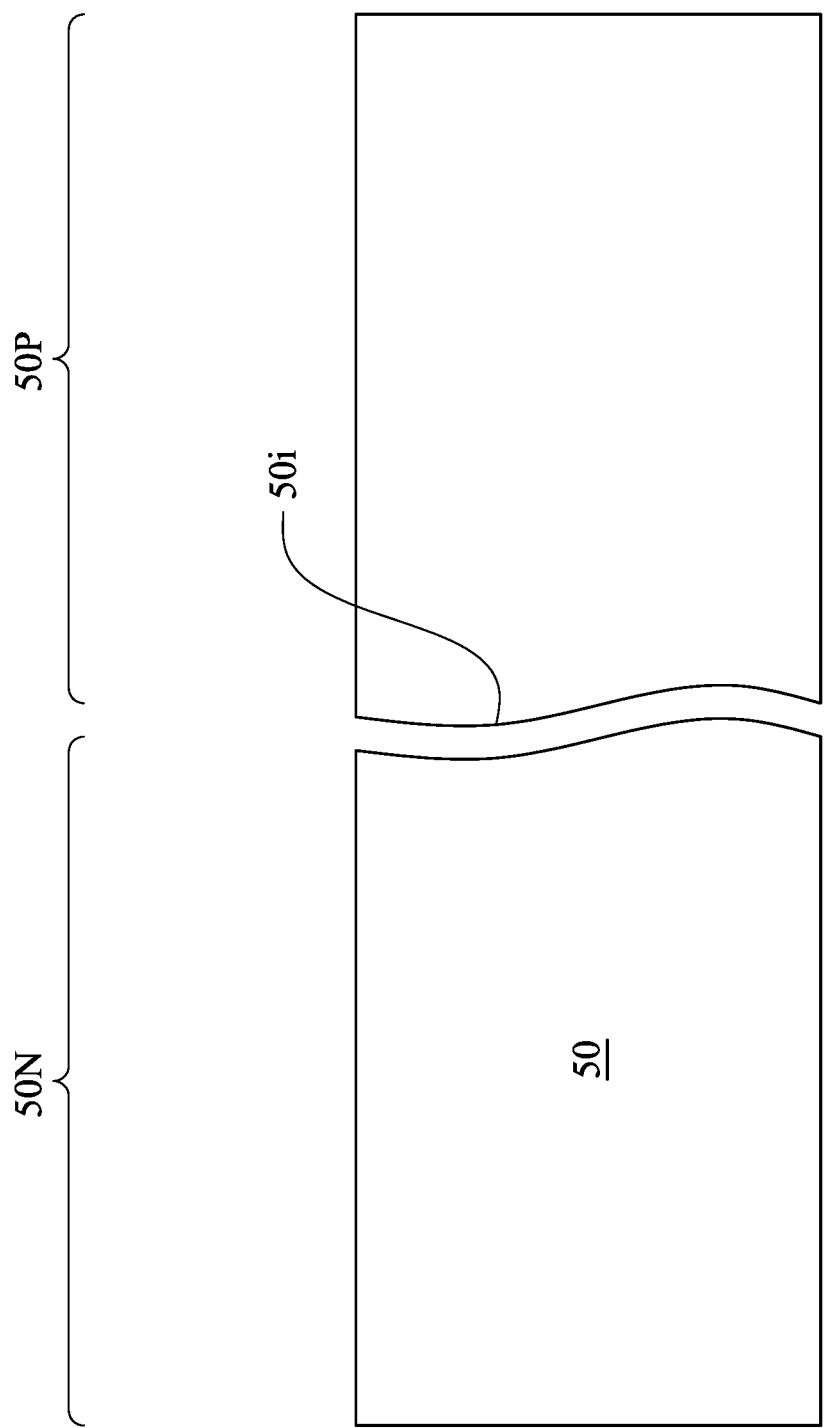
FIGS. 2, 3, 4, 5, 6, 7, 8A, 8B, 9A, 9B, 10A, 10B, 11A, 11B, 12A, 12B, 13A, 13B, 14A, 14B, 15A, 15B, 16A, 16B, 18A, 18B, 18C, 18D, 18E, 18F, 19A, 19B, 20A, 20B, 21A, 21B, 22A, 22B, 22C, 23A, 23B, 24A, and 24B are cross-sectional views of intermediate stages in the manufacturing of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 50i), and any number of device features (e.g., other active devices, doped regions, isolation structures, etc.) may be disposed between the region 50N and the region 50P.

Figure 3:
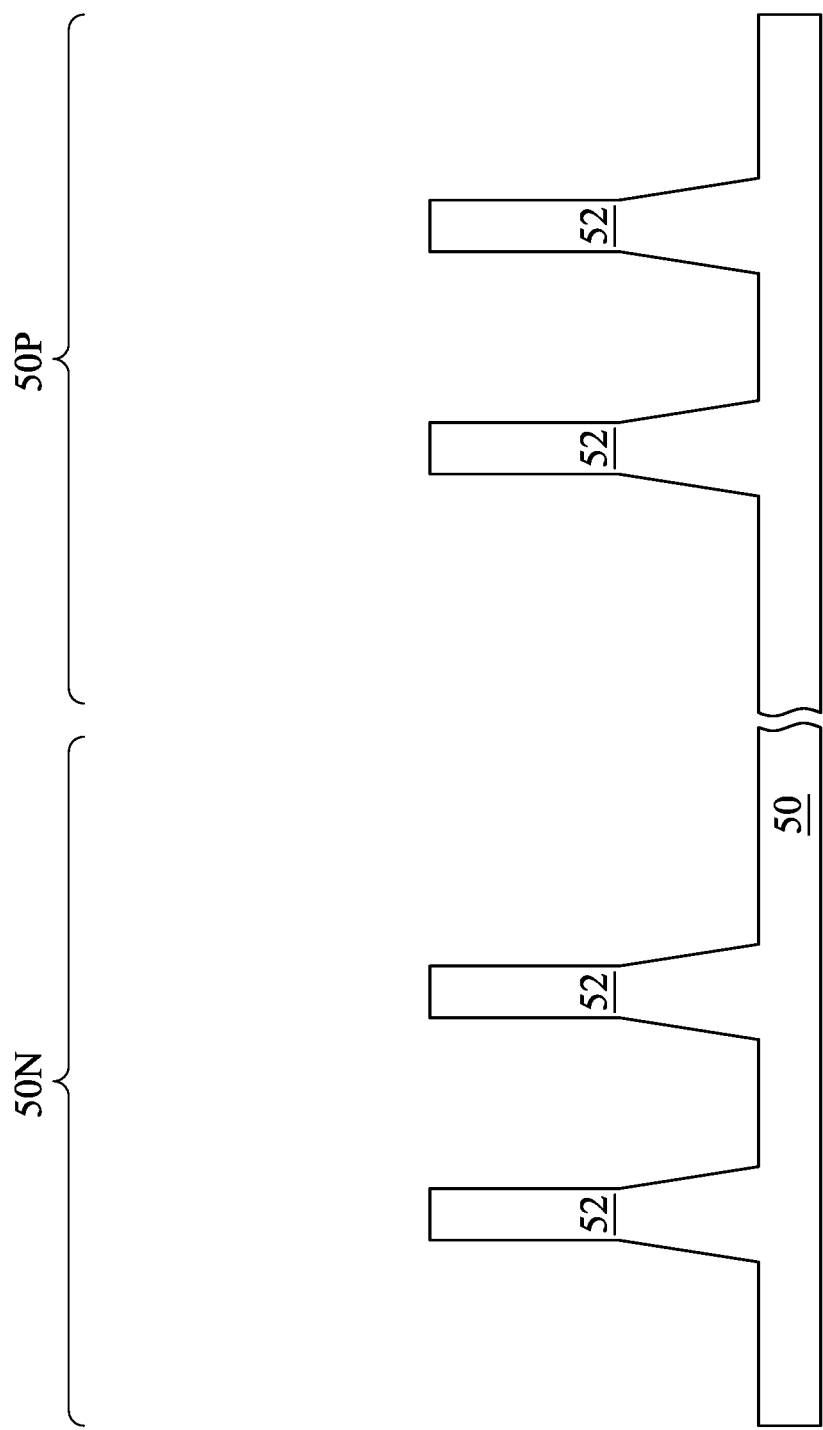

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins 52.

Figure 4:
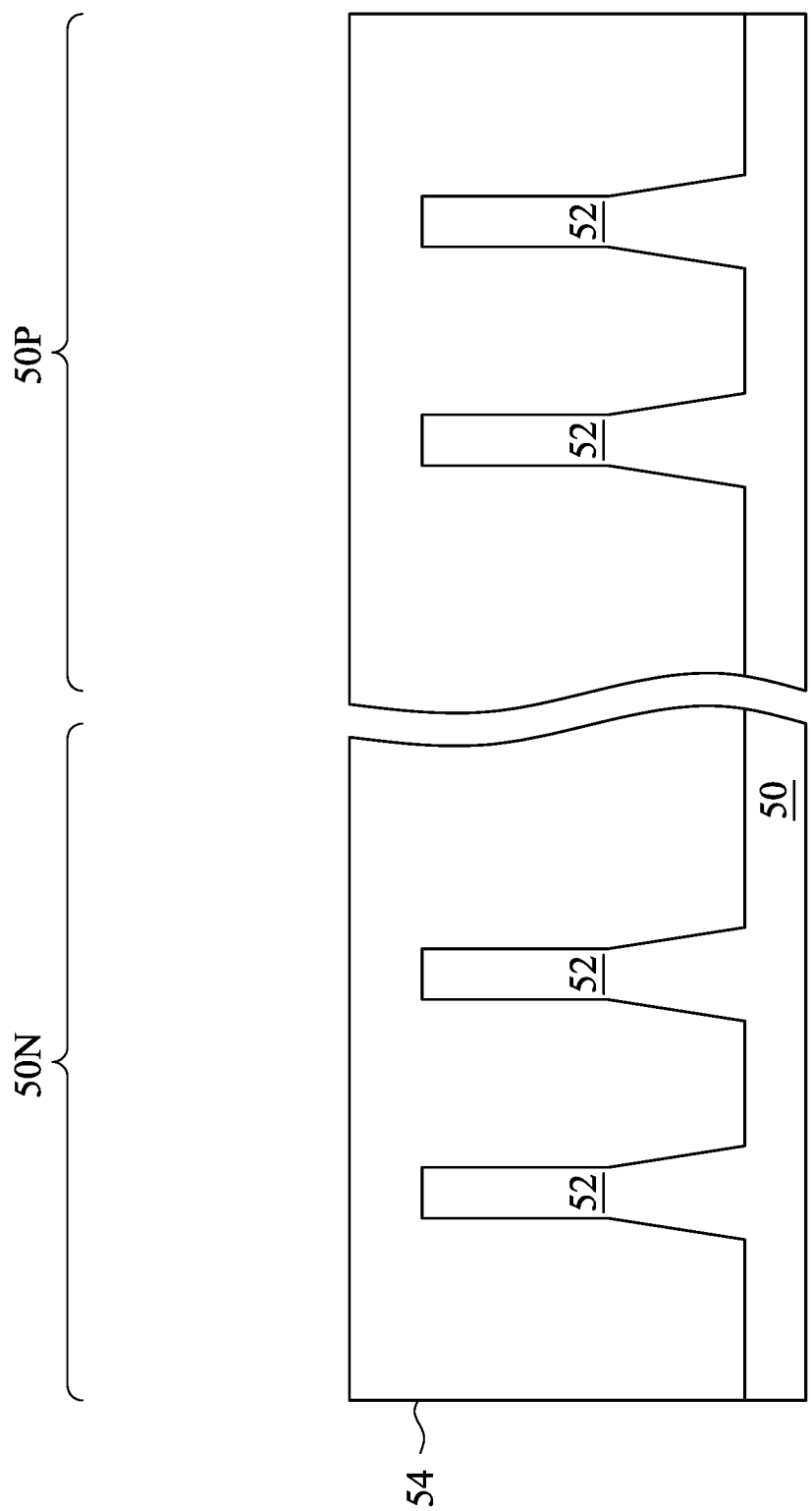

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
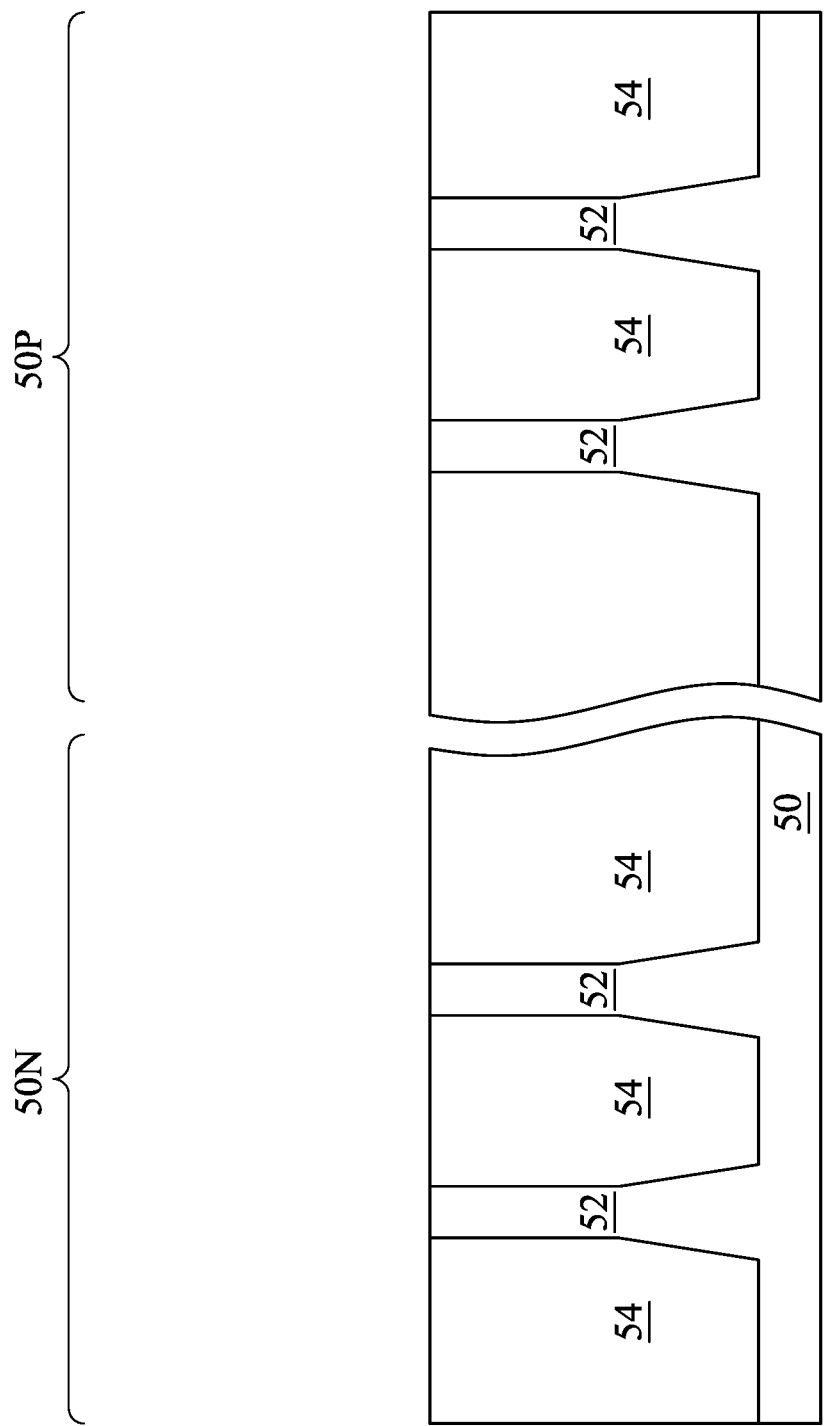

In FIG. 5, a removal process is applied to the insulation material 54 to remove excess portions of the insulation material 54 over the fins 52. In some embodiments, a planarization process, such as a chemical mechanical polish (CMP) process, an etch back process, combinations thereof, or the like, may be utilized. The planarization process exposes the fins 52, such that top surfaces of the fins 52 and the top surface of the insulation material 54 are substantially co-planar or level within process variations of the planarization process after the planarization process is completed.

Figure 6:
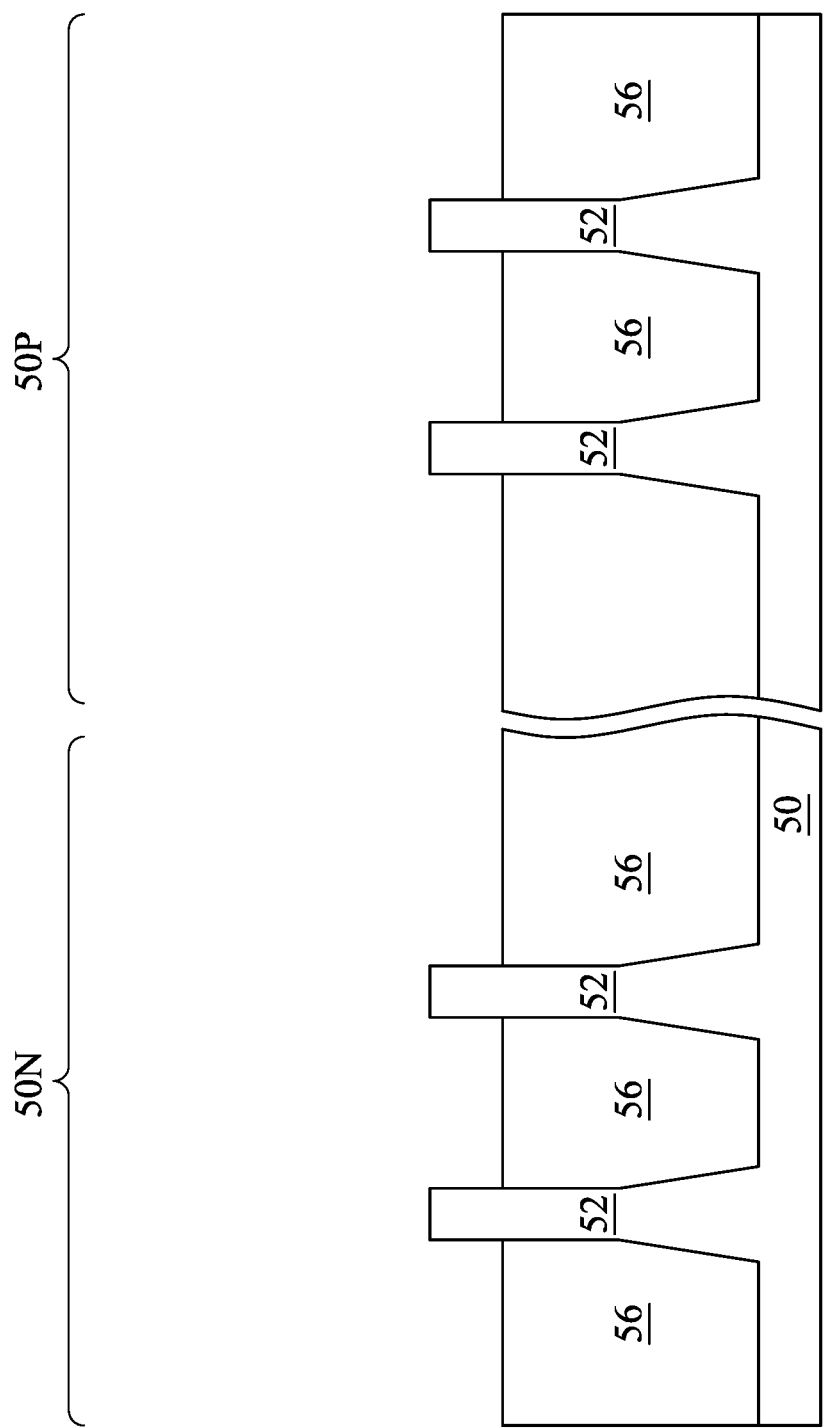

In FIG. 6, the insulation material 54 (see FIG. 5) is recessed to form shallow trench isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a fin material in the region 50N different from a fin material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the STI regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the STI regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
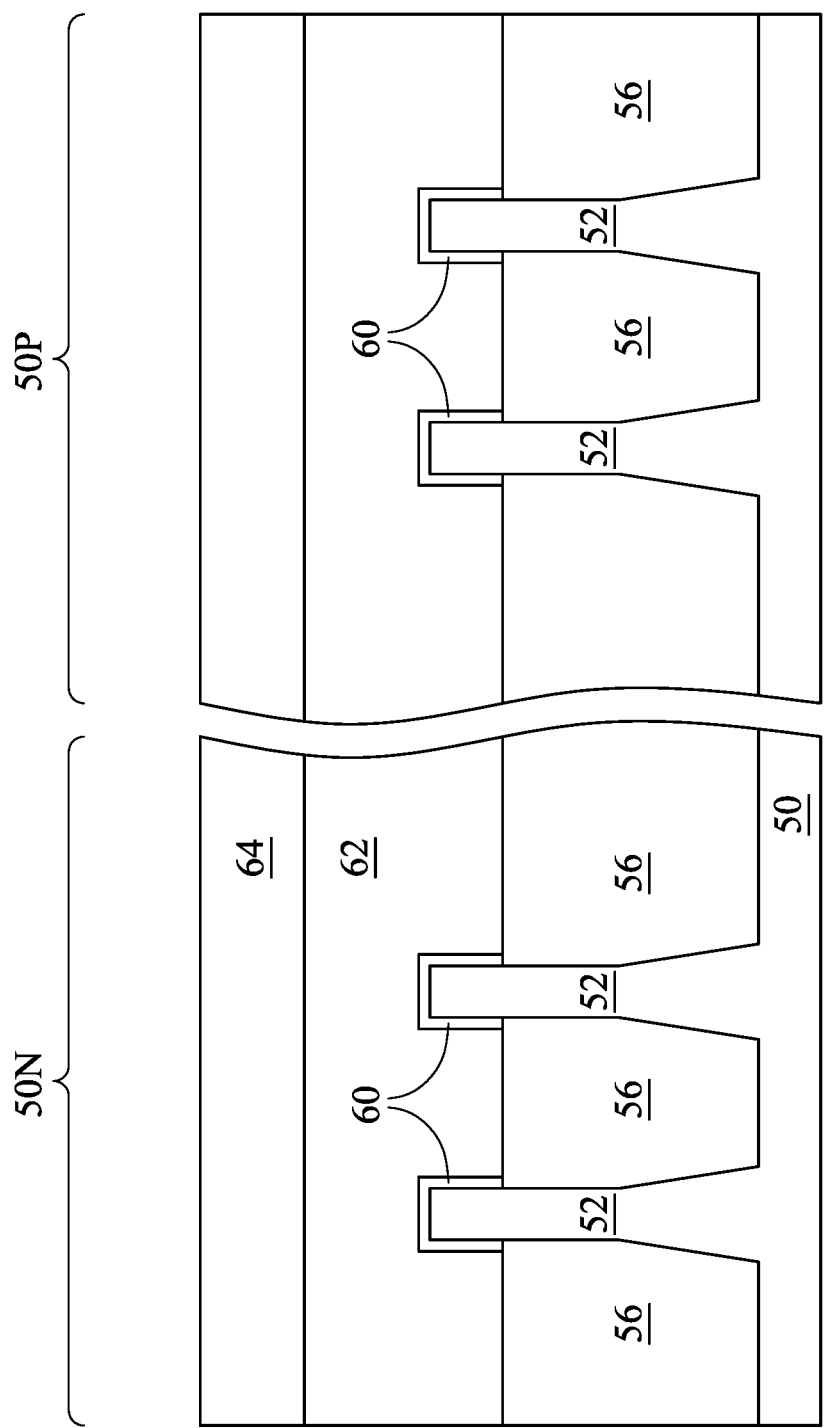

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62.

The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56.

The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 8B:
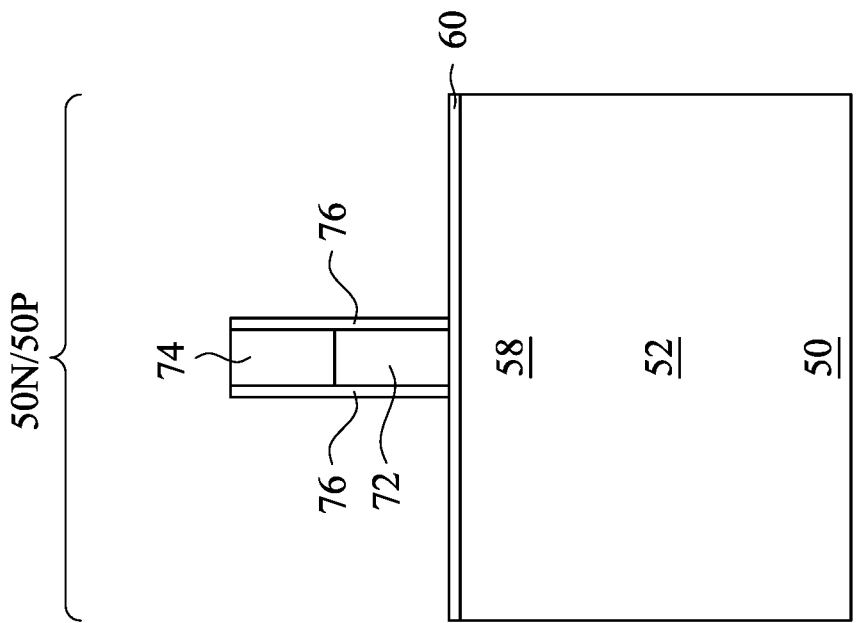
Figure 8A:
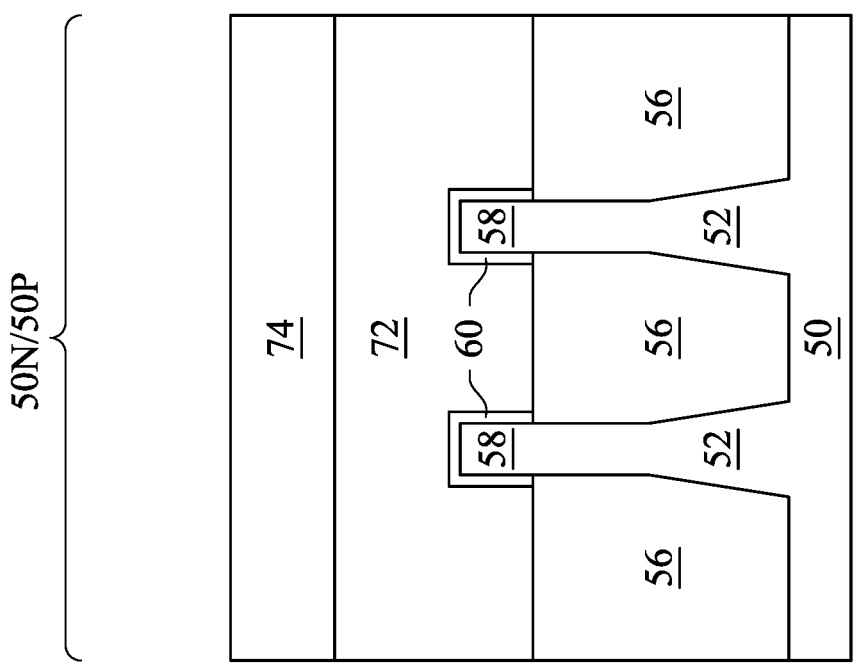

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 may also be referred to as sacrificial gates. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52. As described below in greater detail, the dummy gates 72 may be removed and replaced by replacement gate stacks. In some embodiments, some of the dummy gates 72 may not be removed and may be present in the final structure of the resulting FinFET device.

Further in FIGS. 8A and 8B, gate seal spacers 76 may be formed on exposed surfaces of the dummy gates 72, the masks 74, and/or the fins 52. A thermal oxidation or a deposition followed by an anisotropic etch may form the gate seal spacers 76. The gate seal spacers 76 may be formed of silicon oxide, silicon nitride, silicon oxynitride, a combination thereof, or the like.

After the formation of the gate seal spacers 76, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{18}$ cm$^{-3}$ to about $10^{20}$ cm$^{-3}$. An anneal may be used to repair implant damage and to activate the implanted impurities.

Figure 9B:
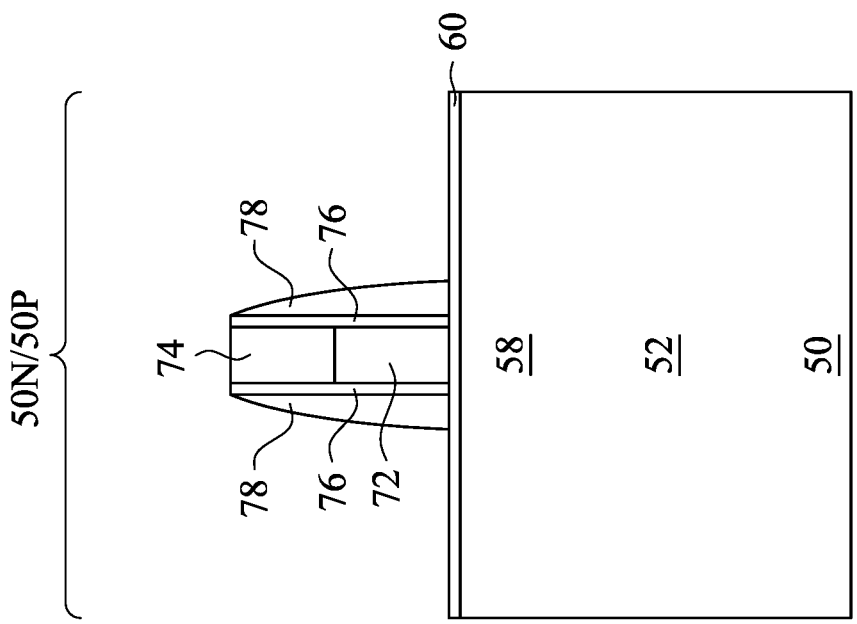
Figure 9A:
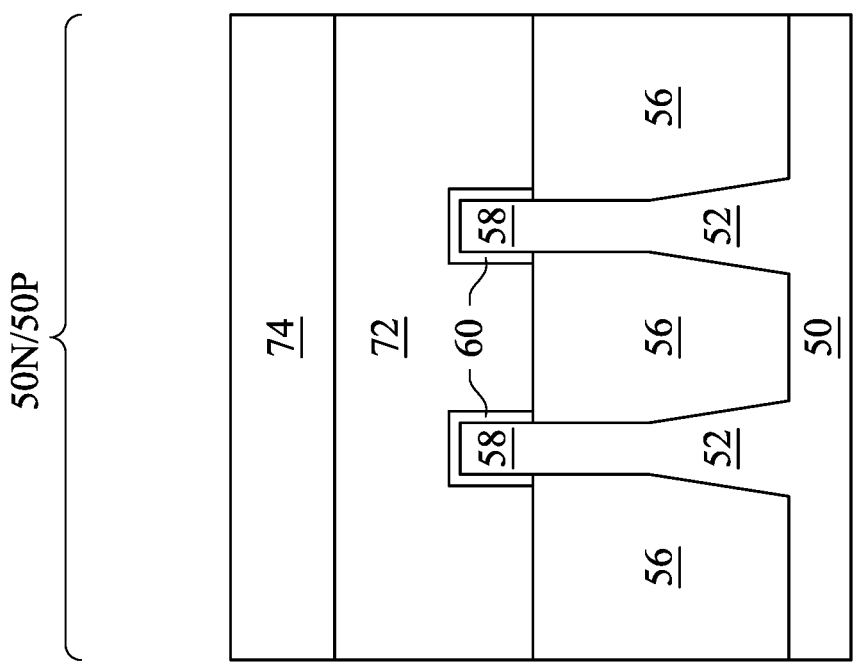

In FIGS. 9A and 9B, gate spacers 78 are formed on the gate seal spacers 76 along sidewalls of the dummy gates 72 and the masks 74. The gate spacers 78 may be formed by conformally depositing an insulating material and subsequently anisotropically etching the insulating material. The insulating material of the gate spacers 78 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 76 may not be etched prior to forming the gate spacers 78, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 76, while the LDD regions for p-type devices may be formed after forming the gate seal spacers 76.

In FIGS. 10A, 10B, 11A, and 11B, source/drain regions 82P are formed in the fins 52 in the region 50P. In some embodiments, a mask such as, for example, a photoresist (not shown) is formed over the region 50N to protect the region 50N from process steps performed on the region 50P to form the source/drain regions 82P. The source/drain regions 82P are formed in the fins 52 such that each dummy gate 72 is disposed between respective neighboring pairs of the source/drain regions 82P. In some embodiments, the source/drain regions 82P may extend into, and may also penetrate through, the fins 52. In some embodiments, the gate spacers 78 are used to separate the source/drain regions 82P from the dummy gates 72 by an appropriate lateral distance so that the source/drain regions 82P do not short out subsequently formed gates of the resulting FinFETs. In some embodiments, the source/drain regions 82P may be formed by epitaxially growing a suitable material, which may be selected to exert stress in the respective channel regions 58, thereby improving performance. The source/drain regions 82P may also be referred to as epitaxial source/drain regions.

Figure 10A:
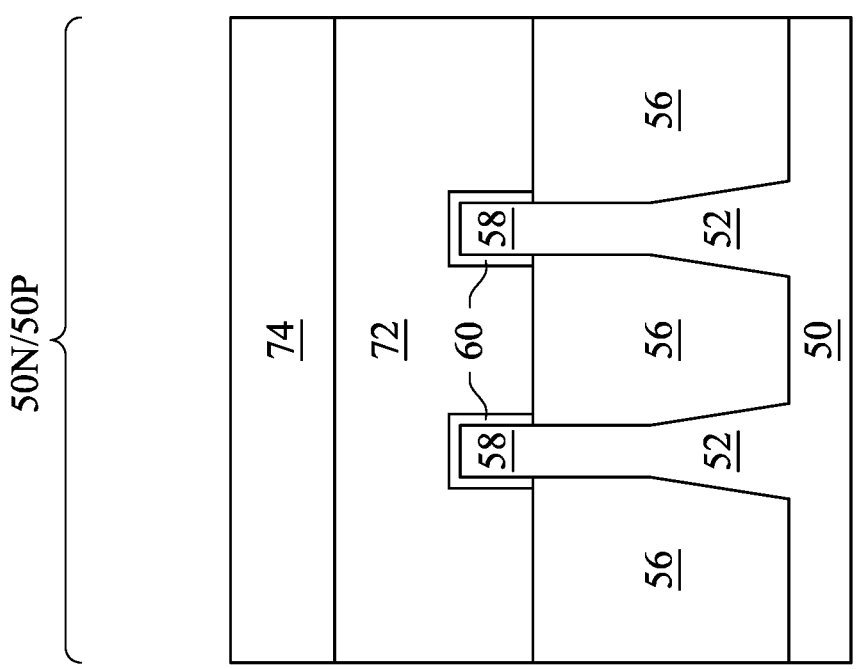
Figure 10B:
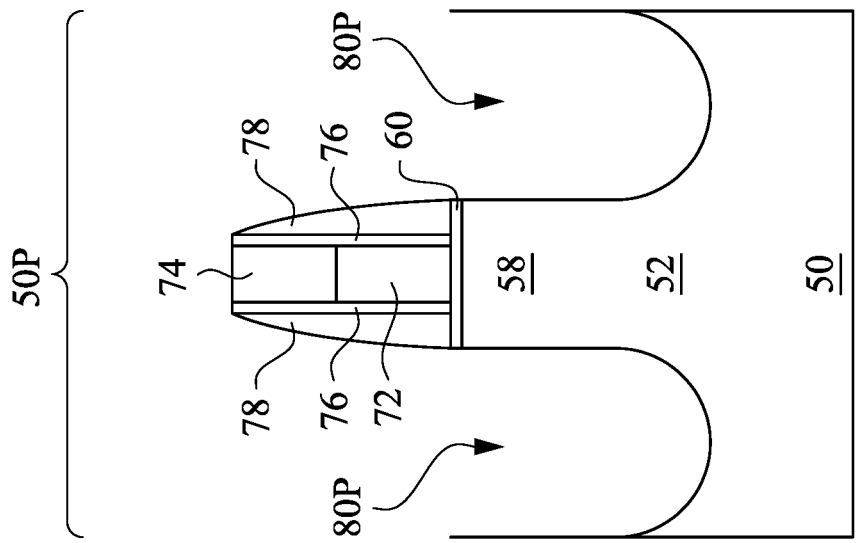
Figure 10B:
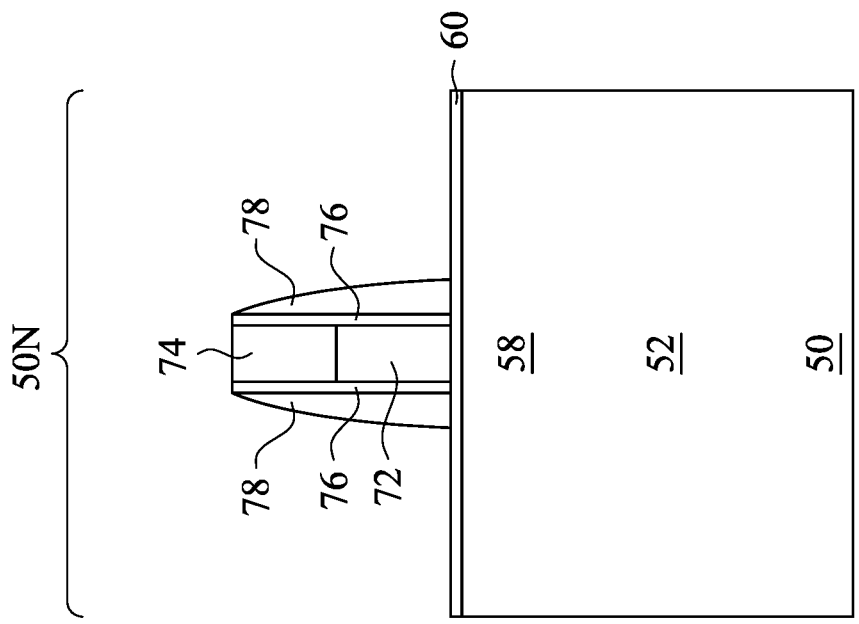

In FIGS. 10A and 10B, the fins 52 in the region 50P are patterned to form recesses 80P in the fins 52. In some embodiments, the patterning process may comprise suitable photolithography and etch processes. The etch processes may comprise one or more dry etch processes, one or more wet etch process, a combination thereof, or the like. The etch processes may be anisotropic.

Figure 11A:
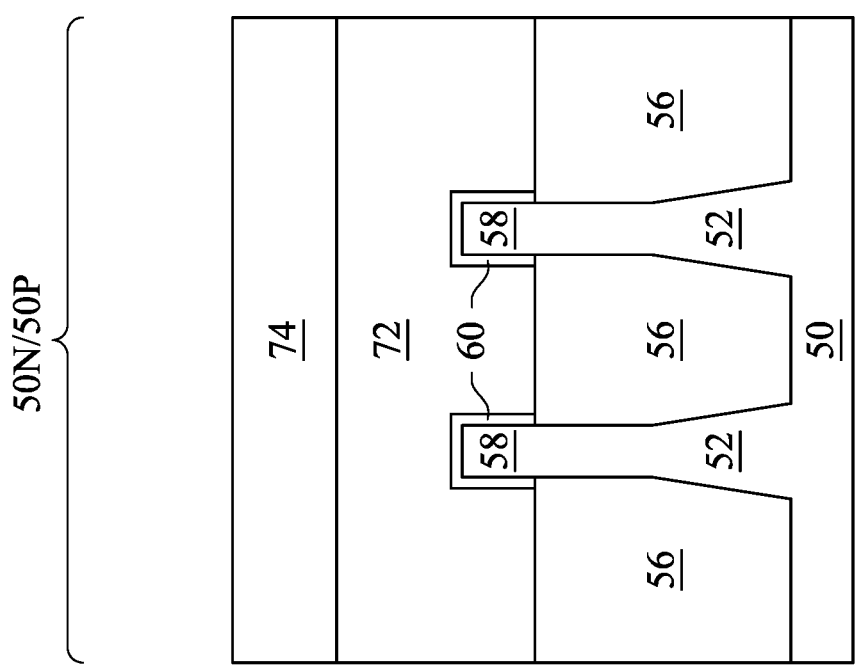
Figure 11B:
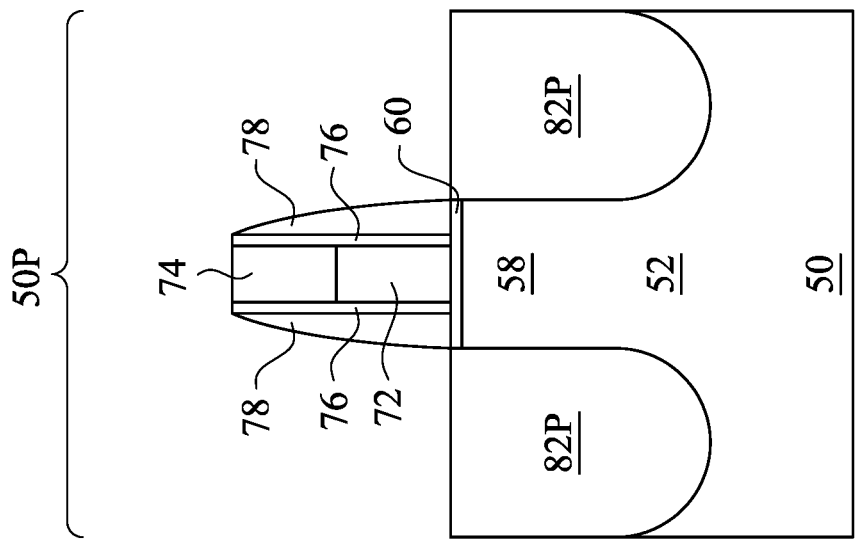
Figure 11B:
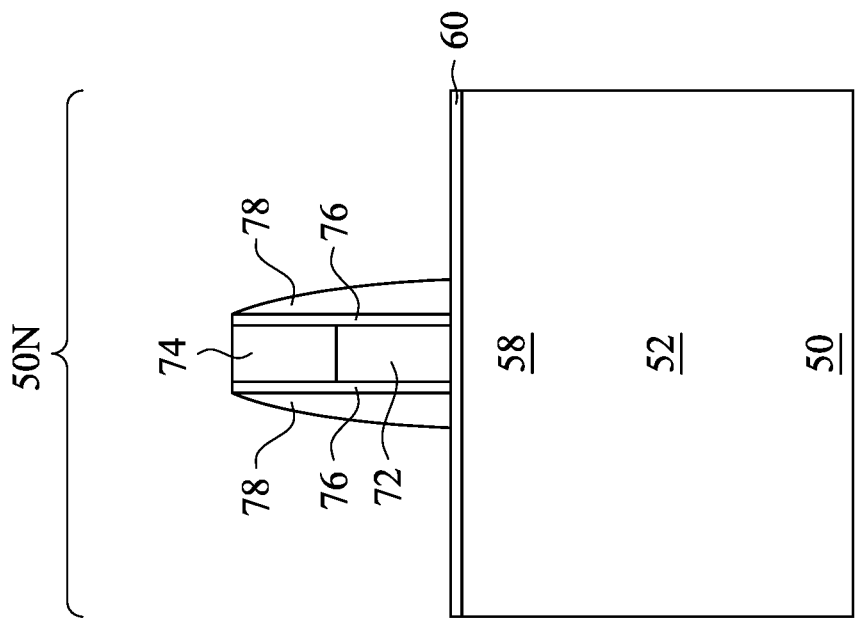

In FIGS. 11A and 11B, after forming the recesses 80P (see FIGS. 10A and 10B), a suitable material is epitaxially grown in the recesses 80P to form the source/drain regions 82P. The source/drain regions 82P may include any acceptable material, such as appropriate for p-type FinFETs. For example, if the fin 52 is silicon, the source/drain regions 82P may comprise materials exerting a compressive strain in the respective channel regions 58, such as silicon-germanium, boron doped silicon-germanium, germanium, germanium tin, or the like. The source/drain regions 82P may have surfaces raised from respective surfaces of the fins 52 and may have facets.

The epitaxially grown material of the source/drain regions 82P and/or the fins 52 may be implanted with dopants, similar to the process previously discussed for forming lightly-doped source/drain regions, followed by an anneal. The source/drain regions 82P may have an impurity concentration of between about $10^{19}$ cm$^{-3}$ and about $10^{21}$ cm$^{-3}$. The p-type impurities for the source/drain regions 82P may be any of the impurities previously discussed. In some embodiments, the epitaxially grown material of the source/drain regions 82P may be in situ doped during growth. In some embodiments, after forming the source/drain regions 82P, the mask formed over the region 50N is removed.

In FIGS. 12A, 12B, 13A, 13B, 14A, 14B, 15A, 15B, 16A, 16B, 17, 18A-18F, source/drain regions 82N are formed in the fins 52 in the region 50N. In some embodiments, a mask such as, for example, a photoresist (not shown) is formed over the region 50P to protect the region 50P from process steps performed in the region 50N to form the source/drain regions 82N. The source/drain regions 82N are formed in the fins 52 such that each dummy gate 72 is disposed between respective neighboring pairs of the source/drain regions 82N. In some embodiments, the source/drain regions 82N may extend into, and may also penetrate through, the fins 52. In some embodiments, the gate spacers 78 are used to separate the source/drain regions 82N from the dummy gates 72 by an appropriate lateral distance so that the source/drain regions 82N do not short out subsequently formed gates of the resulting FinFETs. In some embodiments, the source/drain regions 82N may be formed by epitaxially growing a suitable material, which may be selected to exert stress in the respective channel regions 58, thereby improving performance. The source/drain regions 82N may also be referred to as epitaxial source/drain regions. In the illustrated embodiment, the source/drain regions 82N are formed after forming the source/drain regions 82P. In other embodiments, the source/drain regions 82N are formed before forming the source/drain regions 82P.

Figure 12A:
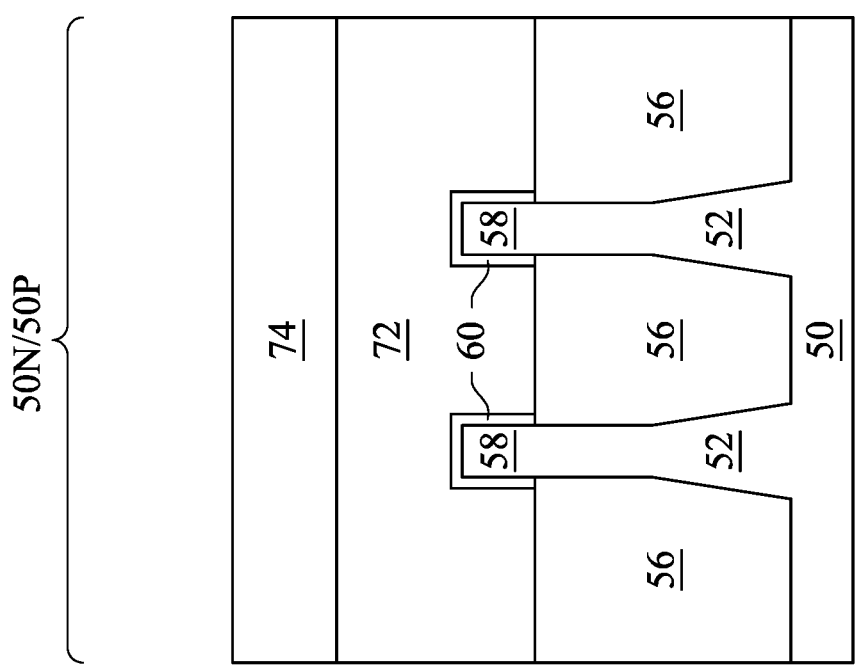
Figure 12B:
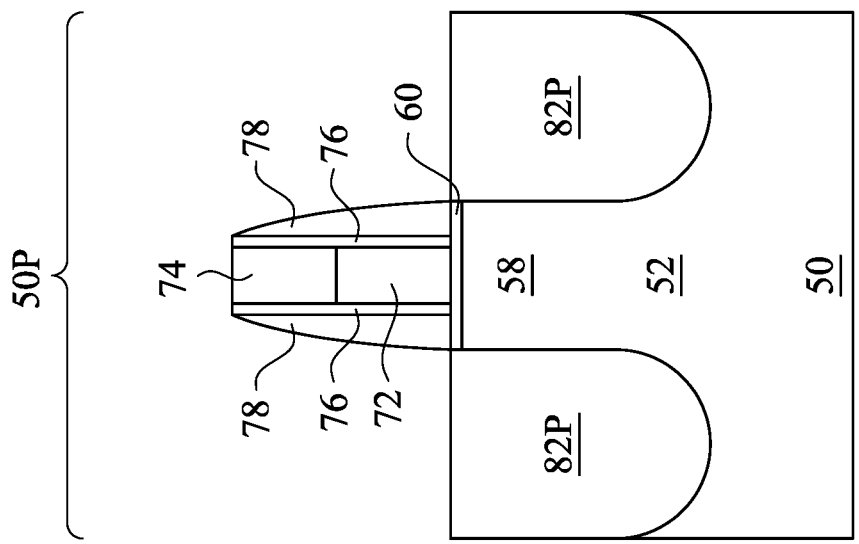
Figure 12B:
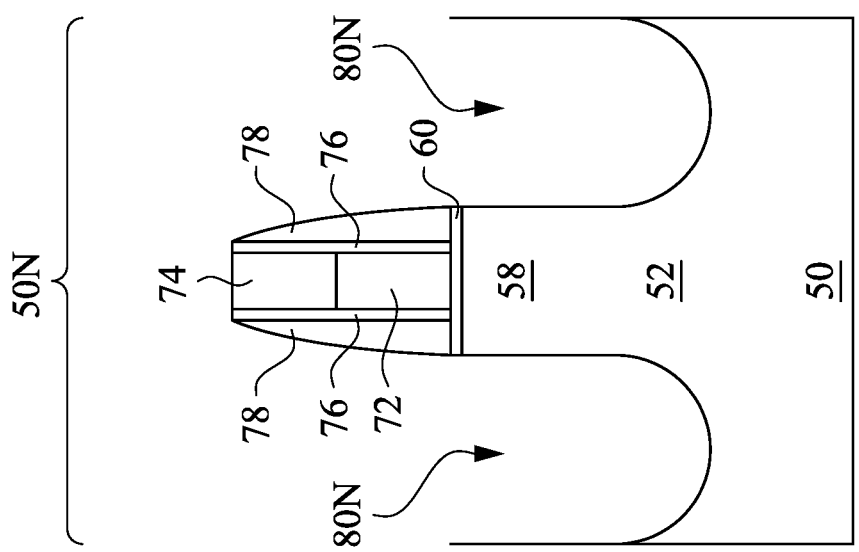

In FIGS. 12A and 12B, the fins 52 in the region 50N are patterned to form recesses 80N in the fins 52. In some embodiments, the patterning process may comprise suitable photolithography and etch processes. The etch processes may comprises one or more dry etch processes, one or more wet etch process, a combination thereof, or the like. The etch processes may be anisotropic.

Figure 13A:
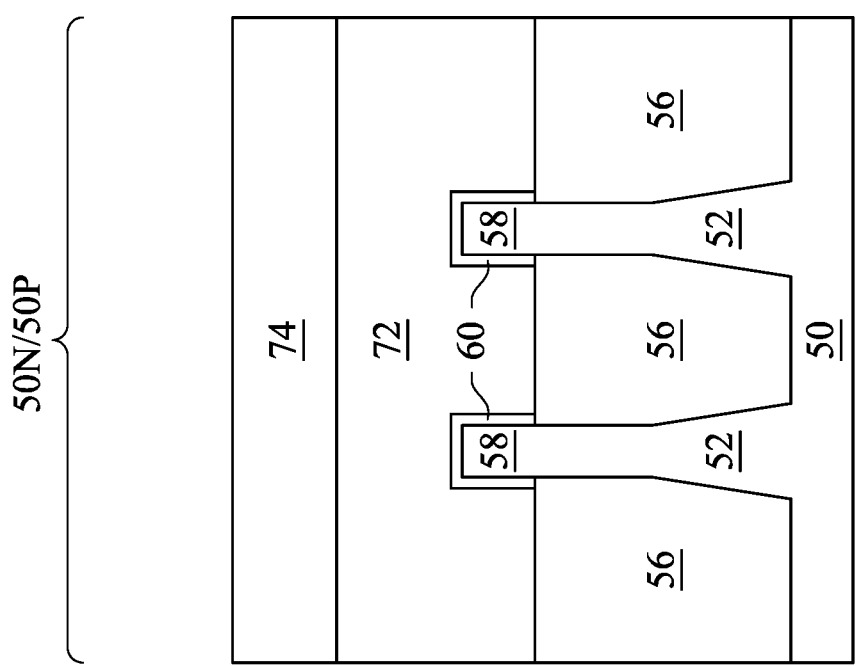
Figure 13B:
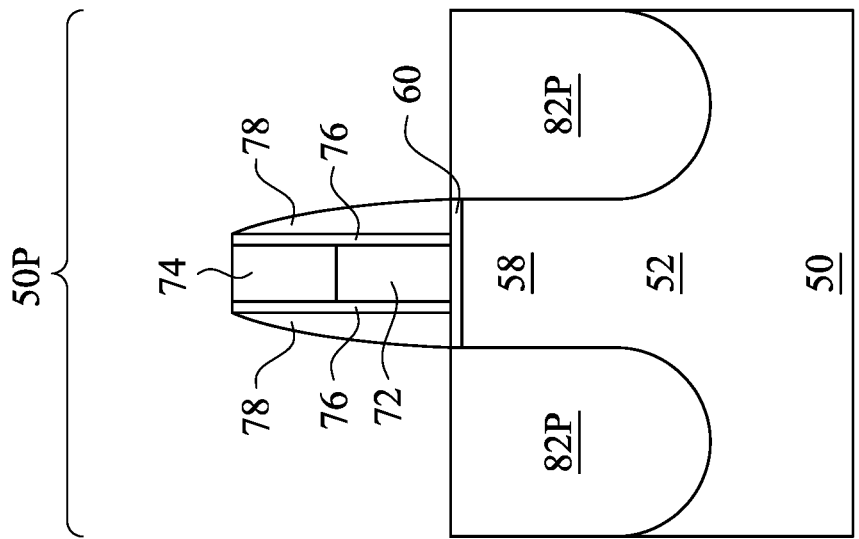
Figure 13B:
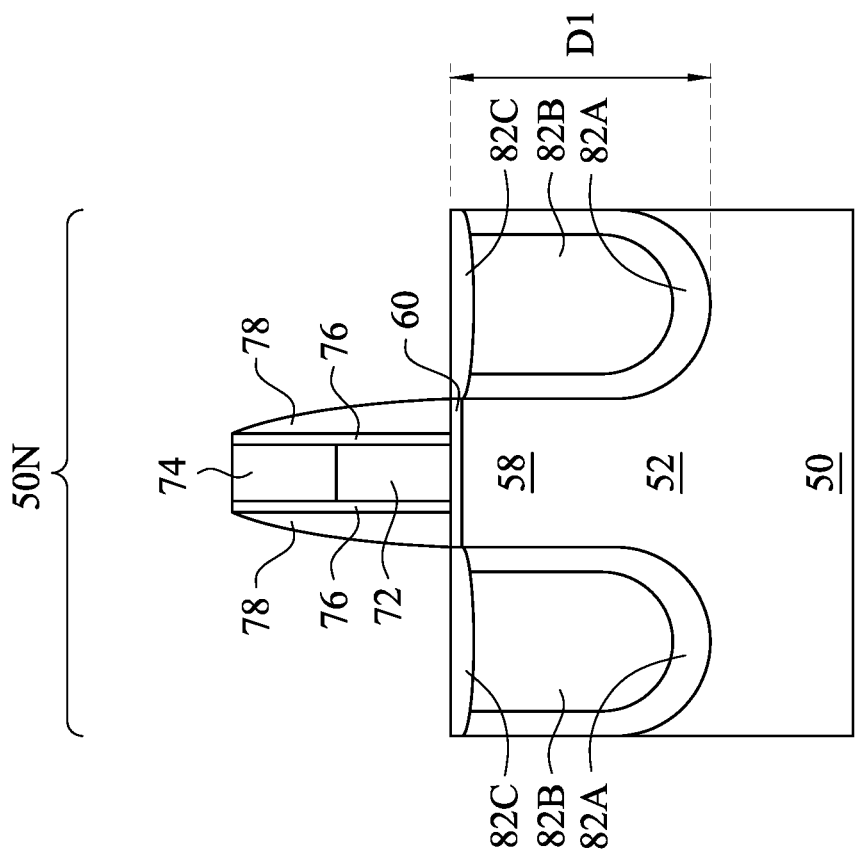

In FIGS. 13A and 13B, after forming the recesses 80N (see FIGS. 12A and 12B), a suitable material is epitaxially grown in the recesses 80N to form the source/drain regions 82N. The source/drain regions 82N may include any acceptable material, such as appropriate for n-type FinFETs. For example, if the fin 52 is silicon, the source/drain regions 82N may include materials exerting a tensile strain in the respective channel regions 58, such as silicon, silicon carbide, phosphorous doped silicon carbide, silicon phosphide, or the like. The source/drain regions 82N in the region 50N may have surfaces raised from respective surfaces of the fins 52 and may have facets.

Further in FIGS. 13A and 13B, in some embodiments, the source/drain regions 82N comprise one or more layers. In the illustrated embodiment, the epitaxial source/drain regions 82N comprises a first layer 82A, a second layer 82B over the first layer 82A, and a third layer 82C over the second layer 82B. In some embodiments, the first layer 82A comprises arsenic-doped silicon (Si:As), the second layer 82B comprises phosphorus-doped silicon (Si:P), and the third layer 82C comprises phosphorus-doped silicon (Si:P). In some embodiments, the first layer 82A, the second layer 82B, and the third layer 82C are epitaxially grown in the recesses 80N (see FIGS. 12A and 12B). In some embodiments, the first layer 82A has a thickness between about 2 nm and about 4 nm. In some embodiments, the second layer 82B has a thickness between about 55 nm and about 65 nm. In some embodiments, the third layer 82C has a thickness between about 1 nm and about 2 nm. In some embodiments, a phosphorus concentration in the second layer 82B is greater than a phosphorus concentration in the third layer 82C. The first layer 82A may have an arsenic concentration between about $10^{20}$ cm$^{-3}$ and about $10^{21}$ cm$^{-3}$. The second layer 82B may have a phosphorus concentration between about $10^{20}$ cm$^{-3}$ and about $10^{21}$ cm$^{-3}$. The third layer 82C may have a phosphorus concentration between about $10^{19}$ cm$^{-3}$ and about $10^{20}$ cm$^{-3}$. The epitaxial structure (comprising the first layer 82A, the second layer 82B, and the third layer 82C) may extend into the fin 52 to a first depth D1. In some embodiments, the first depth D1 is between about 50 nm and about 70 nm.

Figure 14A:
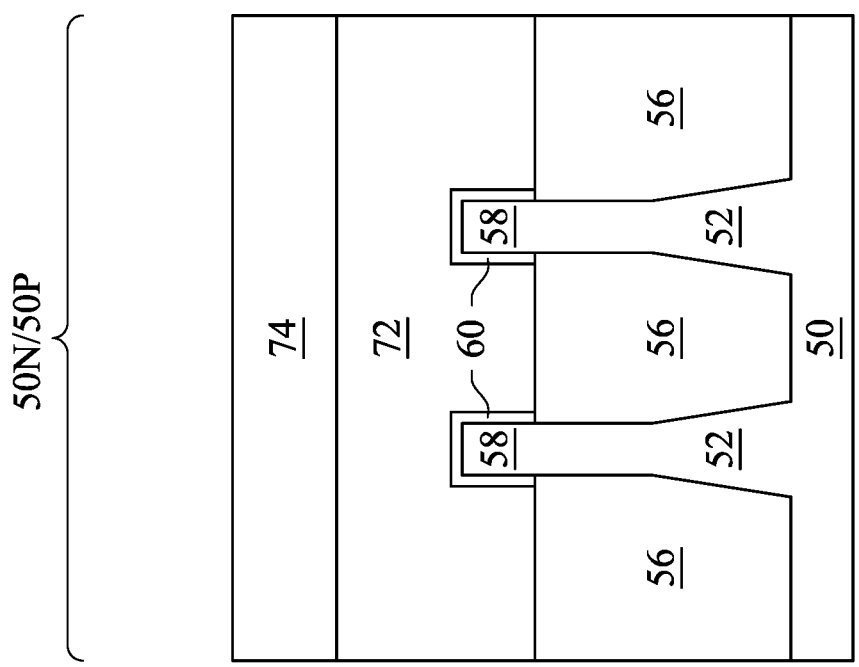
Figure 14B:
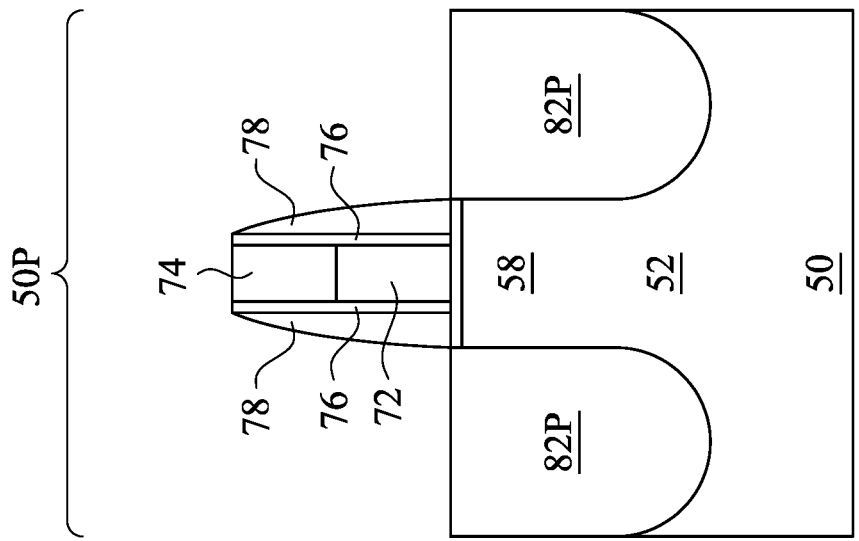
Figure 14B:
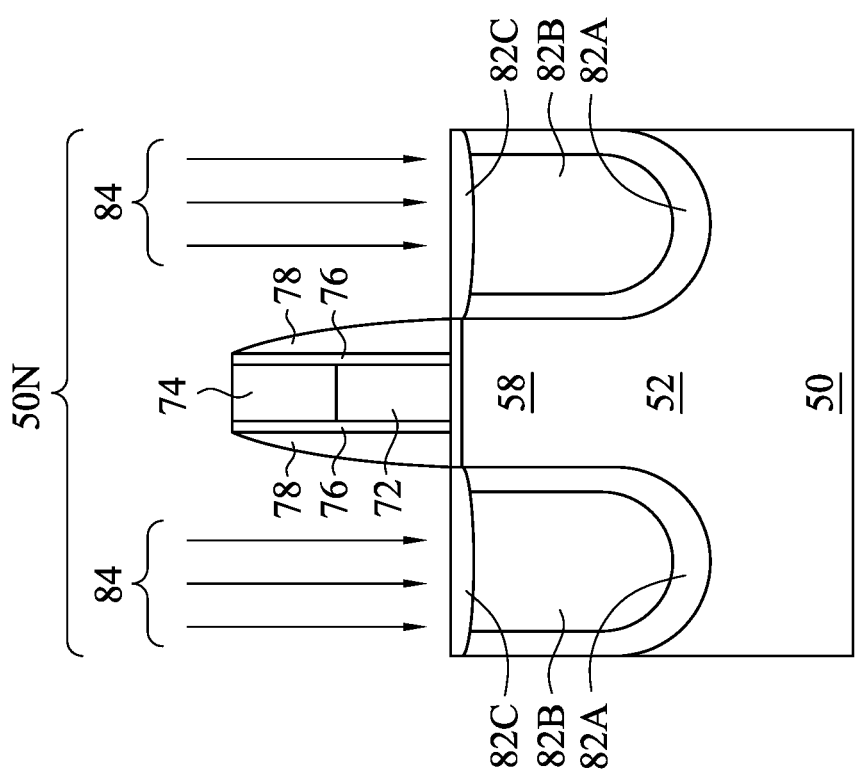

In FIGS. 14A, 14B, 15A, 15B, 16A, and 16B, a plurality of implantation processes are performed on the first layer 82A, the second layer 82B, and the third layer 82C. In FIGS. 14A and 14B, a first implantation process 84 is performed on the first layer 82A, the second layer 82B, and the third layer 82C. In some embodiments, the first implantation process 84 is performed using a medium current ion implanter, or the like. In some embodiments, the first implantation process 84 comprises implanting dopants or implants, such as arsenic (As), phosphorus (P), antimony (Sb), a combination thereof, or the like. In some embodiments, the first implantation process 84 is a low-dose/high energy implantation process.

In some embodiments when the implant is arsenic (As), the first implantation process 84 is performed with an implantation energy between about 10 keV and about 80 keV, with a tilt angle between about 0 and about 15 degrees, with a rotation angle between about 0 and about 360 degrees, at a temperature between about −60° C. and about +450° C., with an implantation depth between about 10 nm and about 60 nm, and with an implant concentration between about $1\times10^{18}$ cm$^{-3}$ and about $1\times10^{20}$ cm$^{-3}$.

In some embodiments when the implant is phosphorus (P), the first implantation process 84 is performed with an implantation energy between about 5 keV and about 50 keV, with a tilt angle between about 0 and about 15 degrees, with a rotation angle between about 0 and about 360 degrees, at a temperature between about −60° C. and about +450° C., with an implantation depth between about 10 nm and about 60 nm, and with an implant concentration between about $1\times10^{18}$ cm$^{-3}$ and about $1\times10^{20}$ cm$^{-3}$.

In some embodiments when the implant is antimony (Sb), the first implantation process 84 is performed with an implantation energy between about 15 keV and about 100 keV, with a tilt angle between about 0 and about 15 degrees, with a rotation angle between about 0 and about 360 degrees, at a temperature between about −60° C. and about +450° C., with an implantation depth between about 10 nm and about 60 nm, and with an implant concentration between about $1\times10^{18}$ cm$^{-3}$ and about $1\times10^{20}$ cm$^{-3}$.

Figure 15A:
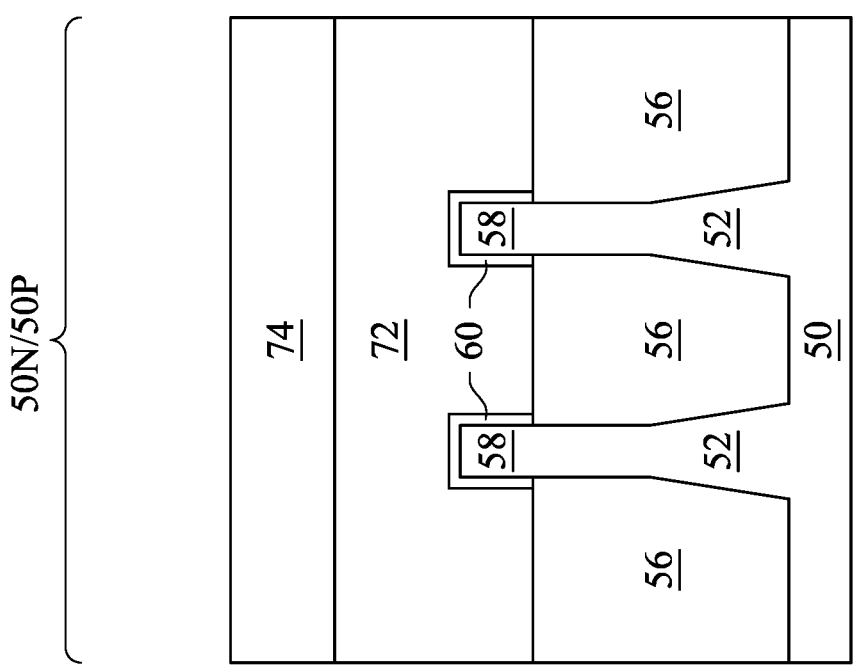
Figure 15B:
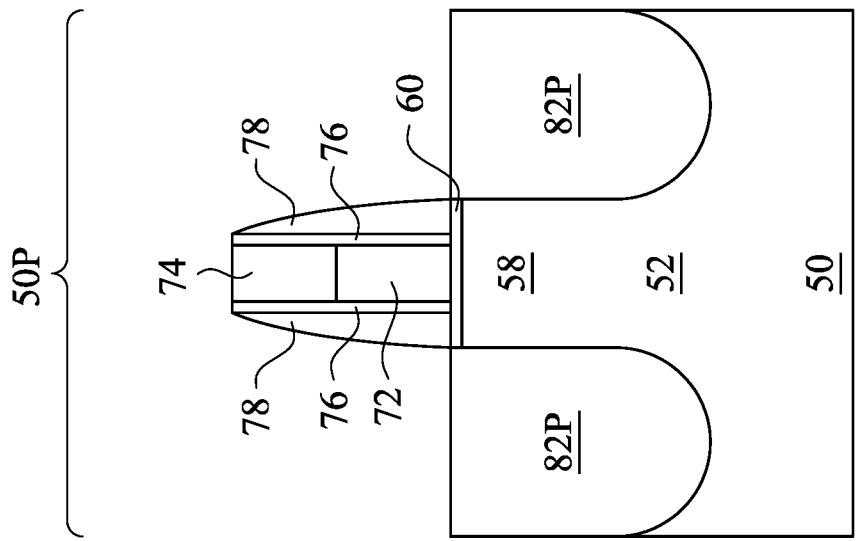
Figure 15B:
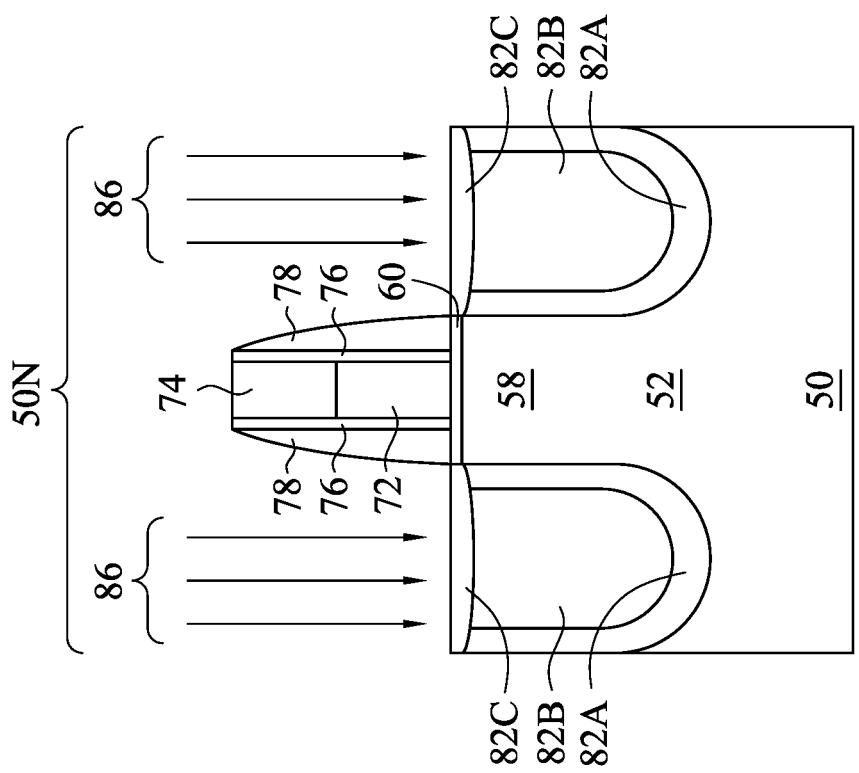

In FIGS. 15A and 15B, after performing the first implantation process 84, a second implantation process 86 is performed on the first layer 82A, the second layer 82B, and the third layer 82C. In some embodiments, the second implantation process 86 is similar to the first implantation process 84 described above with reference to FIGS. 14A and 14B, and the description is not repeated herein. In some embodiments, the second implantation process 86 is a low-dose/high energy implantation process. In some embodiments, the first implant of the first implantation process 84 is same as the second implant of the second implantation process 86. In other embodiments, the first implant of the first implantation process 84 is different from the second implant of the second implantation process 86. In some embodiments, the first implantation energy of the first implantation process 84 is less than the second implantation energy of the second implantation process 86. In other embodiments, the first implantation energy of the first implantation process 84 is greater than the second implantation energy of the second implantation process 86.

Figure 16A:
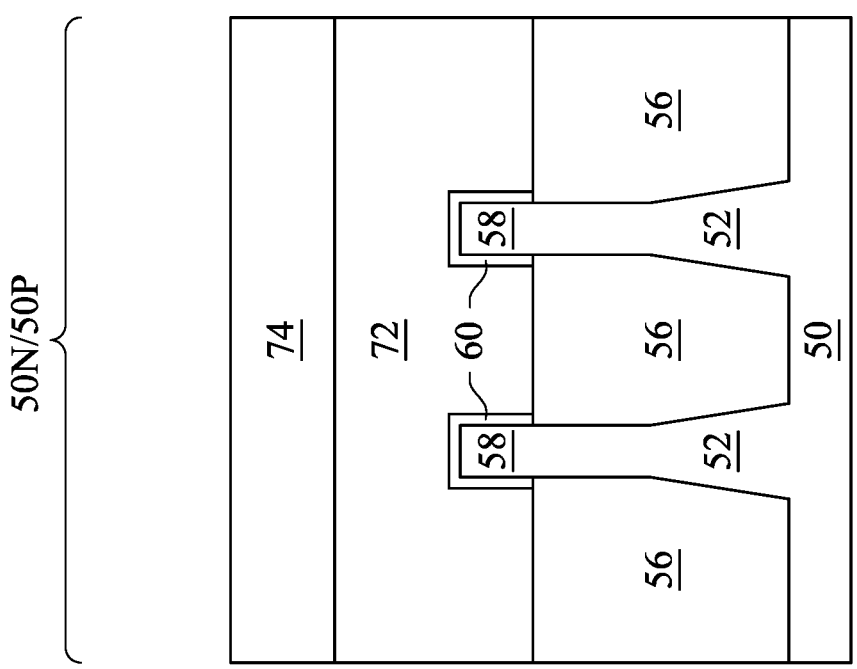
Figure 16B:
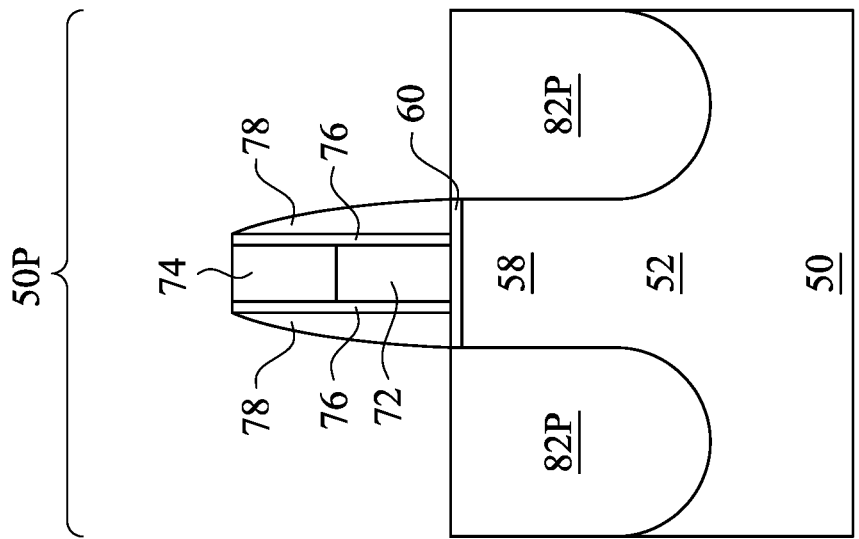
Figure 16B:
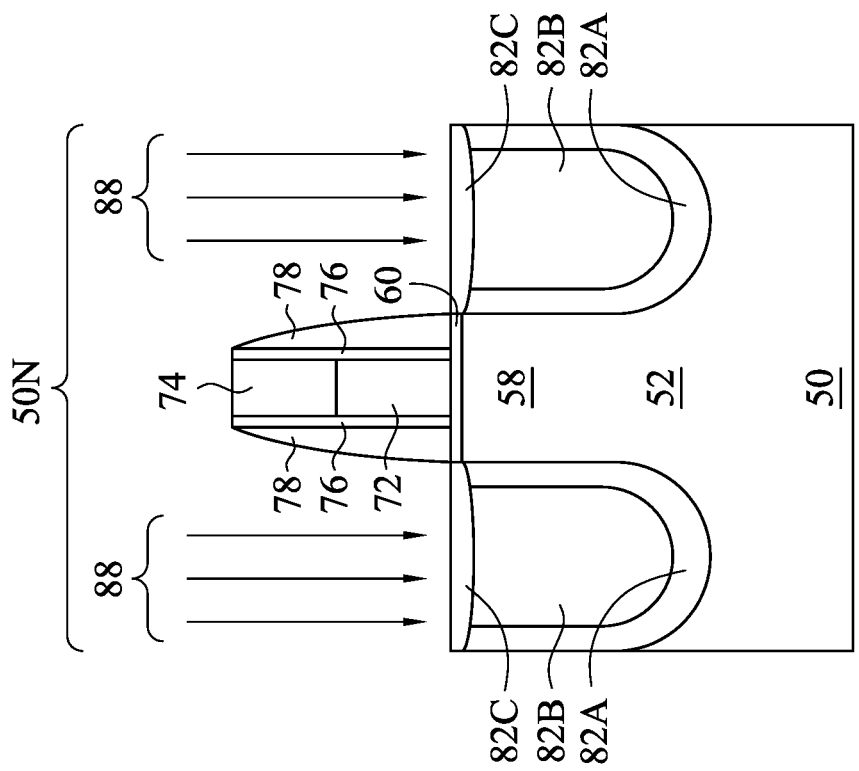

In FIGS. 16A and 16B, after performing the second implantation process 86, a third implantation process 88 is performed on the first layer 82A, the second layer 82B, and the third layer 82C. In some embodiments, the third implantation process 88 is similar to the first implantation process 84 described above with reference to FIGS. 14A and 14B, and the description is not repeated herein. In some embodiments, the third implantation process 88 is a low-dose/high energy implantation process. In some embodiments, the first implant of the first implantation process 84 is same as the third implant of the third implantation process 88. In some embodiments, the first implant of the first implantation process 84 is different from the third implant of the third implantation process 88. In some embodiments, the second implant of the second implantation process 86 is same as the third implant of the third implantation process 88. In some embodiments, the second implant of the second implantation process 86 is different from the third implant of the third implantation process 88. In some embodiments, the first implantation energy of the first implantation process 84 is less than the third implantation energy of the third implantation process 88. In some embodiments, the first implantation energy of the first implantation process 84 is greater than the third implantation energy of the third implantation process 88. In some embodiments, the second implantation energy of the second implantation process 86 is less than the third implantation energy of the third implantation process 88. In some embodiments, the second implantation energy of the second implantation process 86 is greater than the third implantation energy of the third implantation process 88. In some embodiments, the third implantation process 88 is optional and is omitted.

FIG. 17 is a table illustrating a first implant (IMP1) of the first implantation process 84 (see FIGS. 14A and 14B), a second implant (IMP2) of the second implantation process 86 (see FIGS. 15A and 15B), and a third implant (IMP3) of the third implantation process 88 (see FIGS. 16A and 16B) in accordance with some embodiments. In the embodiment #1, the IMP1 is arsenic (As), the IMP2 is arsenic (As), and the third implantation process 88 is omitted. In the embodiment #2, the IMP1 is phosphorus (P), the IMP2 is phosphorus (P), and the third implantation process 88 is omitted. In the embodiment #3, the IMP1 is arsenic (As), the IMP2 is arsenic (As), and the IMP3 is phosphorus (P). In the embodiment #4, the IMP1 is arsenic (As), the IMP2 is phosphorus (P), and the third implantation process 88 is omitted. In the embodiment #5, the IMP1 is arsenic (As), the IMP2 is phosphorus (P), and the IMP3 is phosphorus (P). In the embodiment #6, the IMP1 is phosphorus (P), the IMP2 is phosphorus (P), and the IMP3 is arsenic (As). In the embodiment #7, the IMP1 is phosphorus (P), the IMP2 is arsenic (As), and the third implantation process 88 is omitted. In the embodiment #8, the IMP1 is arsenic (As), the IMP2 is arsenic (As), and the IMP3 is arsenic (As). In the embodiment #9, the IMP1 is phosphorus (P), the IMP2 is phosphorus (P), and the IMP3 is phosphorus (P). In the embodiment #10, the IMP1 is phosphorus (P), the IMP2 is arsenic (As), and the IMP3 is antimony (Sb).

Figure 18A:
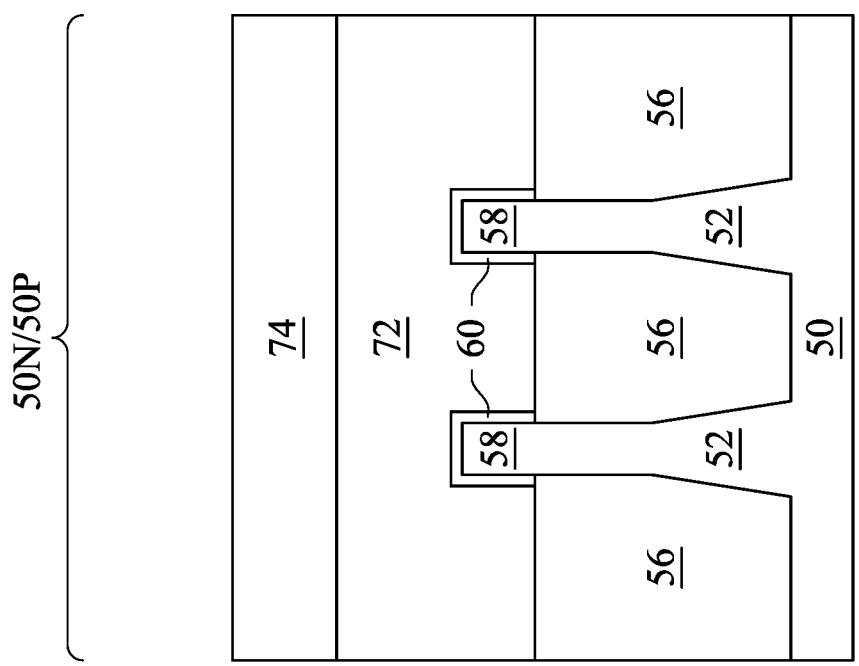
Figure 18B:
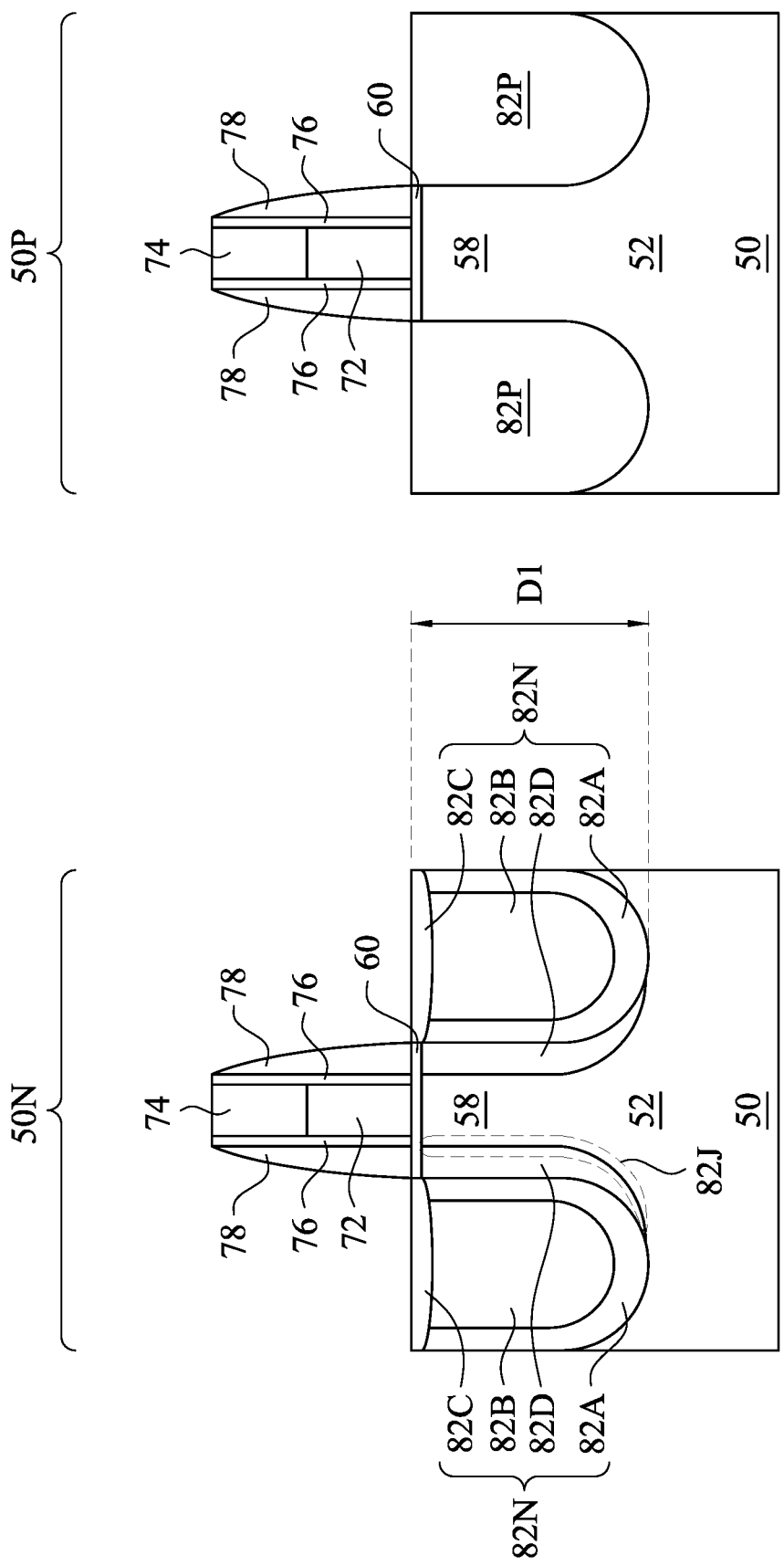

In FIGS. 18A and 18B, after performing the third implantation process 88 (see FIGS. 16A and 16B), an anneal process is performed on the first layer 82A, the second layer 82B, and the third layer 82C to form the source/drain region 82N. In some embodiments, the anneal process activates implants implanted by the first implantation processes 84 (see FIGS. 14A and 14B), the second implantation processes 86 (see FIGS. 15A and 15B), and the third implantation processes 88 (see FIGS. 16A and 16B). In some embodiments, the anneal process is performed for a duration between about 1 μs and about 1 s, and at a temperature between about 1000° C. and about 12000° C. In some embodiments, the anneal process causes some of the implants to diffuse into the channel regions 58 of the fins 52 to form doped regions 82D of the source/drain regions 82N at interfaces between the epitaxial structure (comprising the first layer 82A, the second layer 82B, and the third layer 82C) and the respective fins, and to form pn junctions 82J at interfaces between the doped regions 82D and the respective channel regions 58 of the fins 52. In some embodiments when the first implantation process 84, the second implantation process 86 and the third implantation process 88 are low-dose/high energy implantation processes, the doped regions 82D and the pn junctions 82J extend to a depth that is substantially equal to the first depth D1 of the epitaxial structure (comprising the first layer 82A, the second layer 82B, and the third layer 82C), and do not extend too deep into respective channel regions 58 of the fins 52. Accordingly, short channel effects may be reduced or avoided. In some embodiments, the doped regions 82D have an implant concentration between about $1 \times 10^{18}$ cm$^{-3}$ and about $1 \times 10^{19}$ cm$^{-3}$.

In some embodiments, the implantation processes and the anneal process described above with reference to FIGS. 14A, 14B, 15A, 15B, 16A, 16B, 18A, and 18B allow for reducing a channel resistance ($R_{ch}$) and a parasitic resistance ($R_p$) of the resulting FinFET device, reducing formation of P4V clusters (such as vacancies surrounded by 4 nearest-neighbor phosphorus atoms) in the source/drain regions 82N to improve implant activation and reduce dopant diffusion. The implantation processes and the anneal process described above with reference to FIGS. 14A, 14B, 15A, 15B, 16A, 16B, 18A, and 18B further allow for forming deep diffusion-less pn junctions 82J between source/drain regions 82N and respective channel regions 58, providing desired implant activation for device performance requirement, shortening an effective channel length of the channel regions 58, and keeping lower drain-induced barrier lowering (DIBL). By performing the implantation processes and the anneal process described above with reference to FIGS. 14A, 14B, 15A, 15B, 16A, 16B, 18A, and 18B, the pn junctions 82J are accurately and controllably defined, and implant profiles of the source/drain regions 82N are controllably modulated.

Figure 18C:
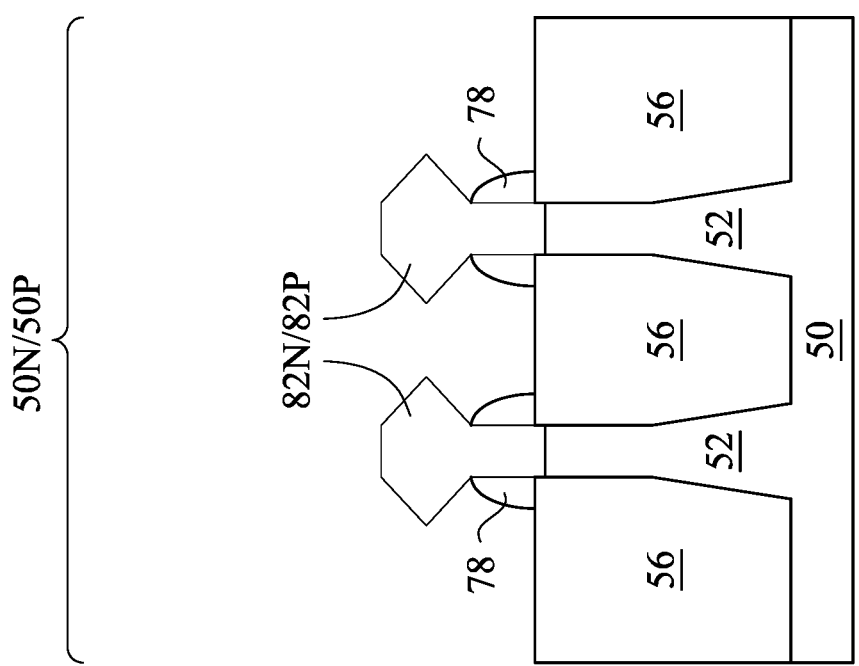
Figure 18E:
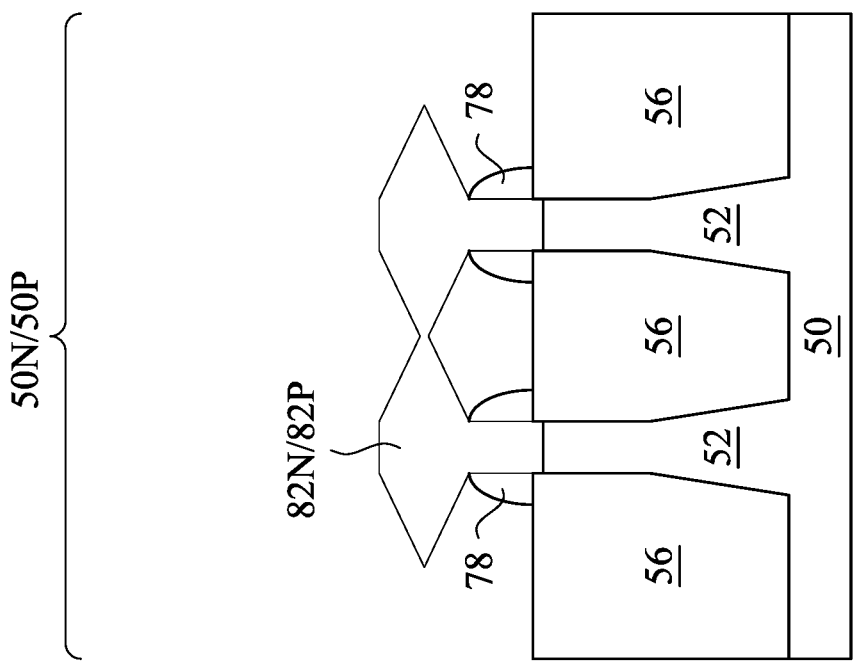

As a result of the epitaxy processes used to form the source/drain regions 82N in the region 50N and the source/drain regions 82P in the region 50P, upper surfaces of the source/drain regions 82N and 82P have facets which expand laterally outward beyond sidewalls of the fins 52. In some embodiments, the adjacent source/drain regions 82N and 82P remain separated after the epitaxy process is completed as illustrated in FIG. 18C. In other embodiments, these facets cause adjacent source/drain regions 82N and 82P of a same FinFET to merge as illustrated by FIG. 18E. In the embodiments illustrated in FIGS. 18C and 18E, gate spacers 78 are formed covering a portion of the sidewalls of the fins 52 that extend above the STI regions 56 thereby blocking the epitaxial growth. In some other embodiments, the spacer etch used to form the gate spacers 78 may be adjusted to remove the spacer material to allow the epitaxially grown region to extend to the surface of the STI region 56.

Figure 18D:
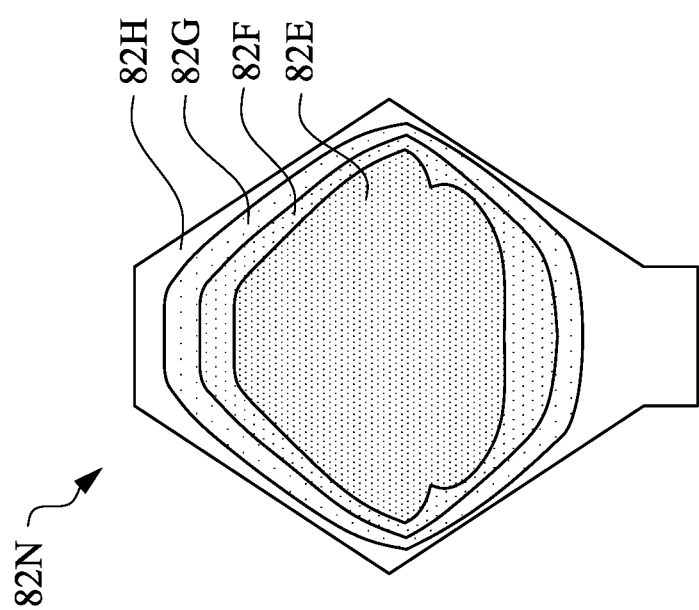

FIG. 18D illustrates an implant profile of the unmerged source/drain region 82N shown in FIG. 18C in accordance with some embodiments. In some embodiments, the unmerged source/drain region 82N comprises a first region 82E in the interior of the unmerged source/drain region 82N and having a first implant concentration, a second region 82F surrounding the first region 82E and having a second implant concentration less than the first implant concentration, a third region 82G surrounding the second region 82F and having a third implant concentration less than the second implant concentration, a fourth region 82H surrounding the third region 82G and having a fourth implant concentration less than the third implant concentration. In some embodiments, the first implant concentration is between about $1 \times 10^{18}$ cm$^{-3}$ and about $1 \times 10^{20}$ cm$^{-3}$. In some embodiments, the second implant concentration is between about $1 \times 10^{18}$ cm$^{-3}$ and about $1 \times 10^{20}$ cm$^{-3}$. In some embodiments, the third implant concentration is between about $1 \times 10^{18}$ cm$^{-3}$ and about $1 \times 10^{20}$ cm$^{-3}$. In some embodiments, the fourth implant concentration is between about $1 \times 10^{18}$ cm$^{-3}$ and about $1 \times 10^{20}$ cm$^{-3}$.

Figure 18F:
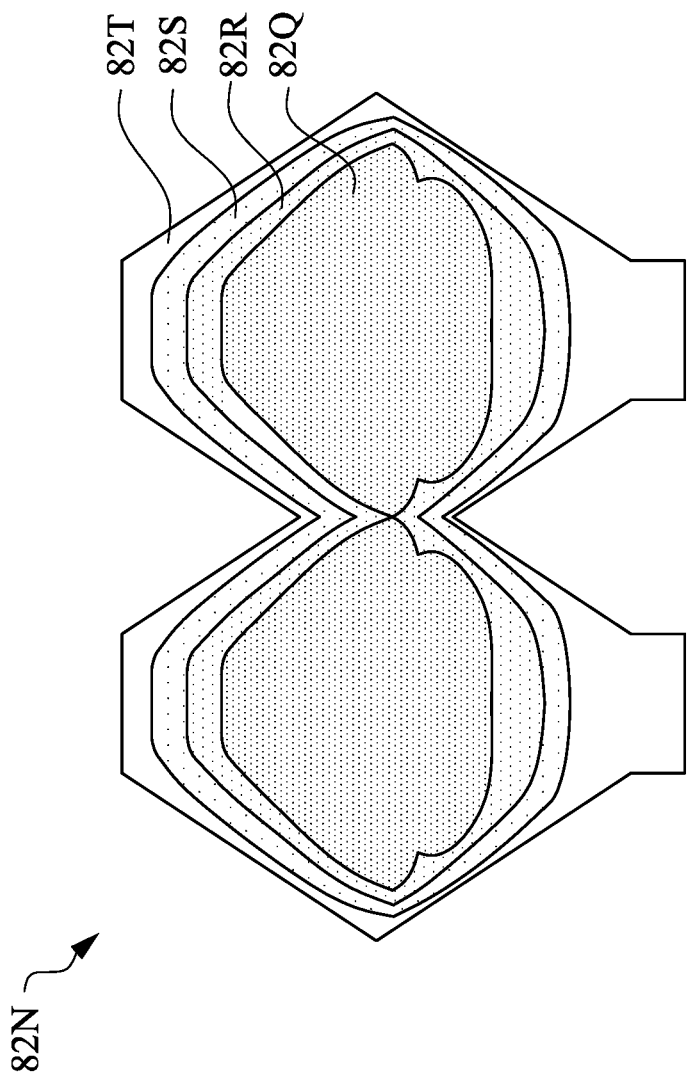

FIG. 18F illustrates an implant profile of the merged source/drain region 82N shown in FIG. 18E in accordance with some embodiments. In some embodiments, the merged source/drain region 82N comprises a first region 82Q in the interior of the merged source/drain region 82N and having a first implant concentration, a second region 82R surrounding the first region 82Q and having a second implant concentration less than the first implant concentration, a third region 82S surrounding the second region 82R and having a third implant concentration less than the second implant concentration, a fourth region 82T surrounding the third region 82S and having a fourth implant concentration less than the third implant concentration. In some embodiments, the first implant concentration is between about $1 \times 10^{18}$ cm$^{-3}$ and about $1 \times 10^{20}$ cm$^{-3}$. In some embodiments, the second implant concentration is between about $1 \times 10^{18}$ cm$^{-3}$ and about $1 \times 10^{20}$ cm$^{-3}$. In some embodiments, the third implant concentration is between about $1 \times 10^{18}$ cm$^{-3}$ and about $1\times10^{20}$ cm$^{-3}$. In some embodiments, the fourth implant concentration is between about $1\times10^{18}$ cm$^{-3}$ and about $1\times10^{20}$ cm$^{-3}$.

Figure 19A:
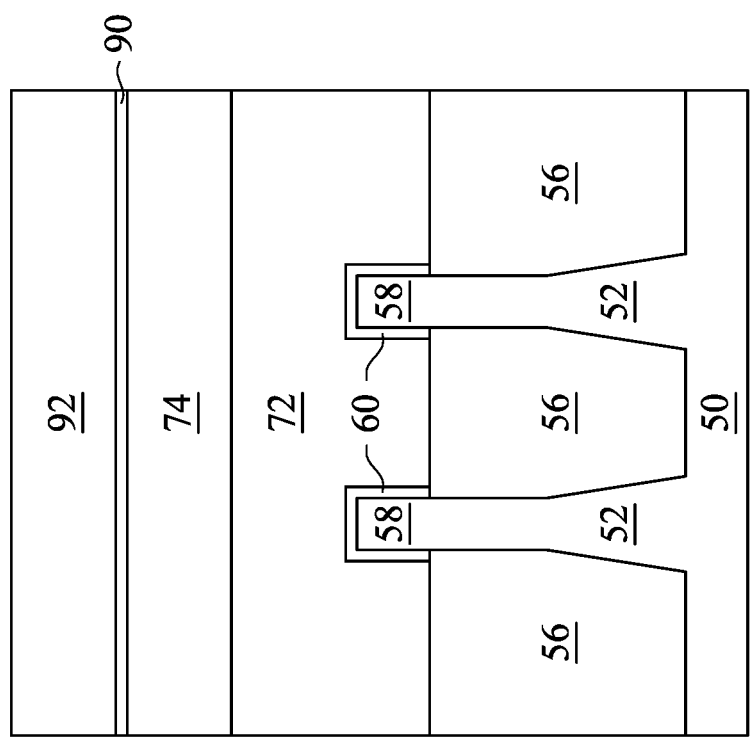
Figure 19B:
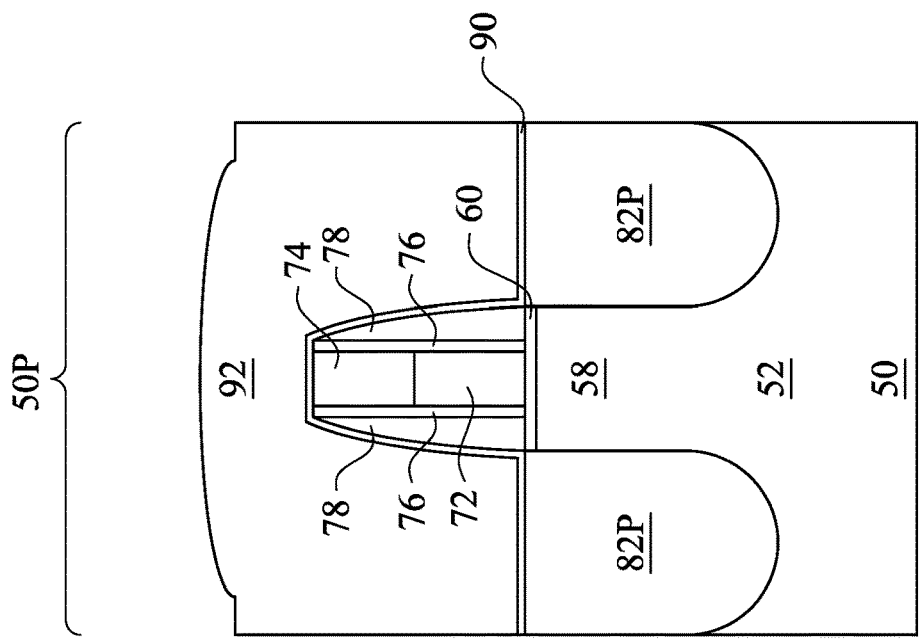
Figure 19B:
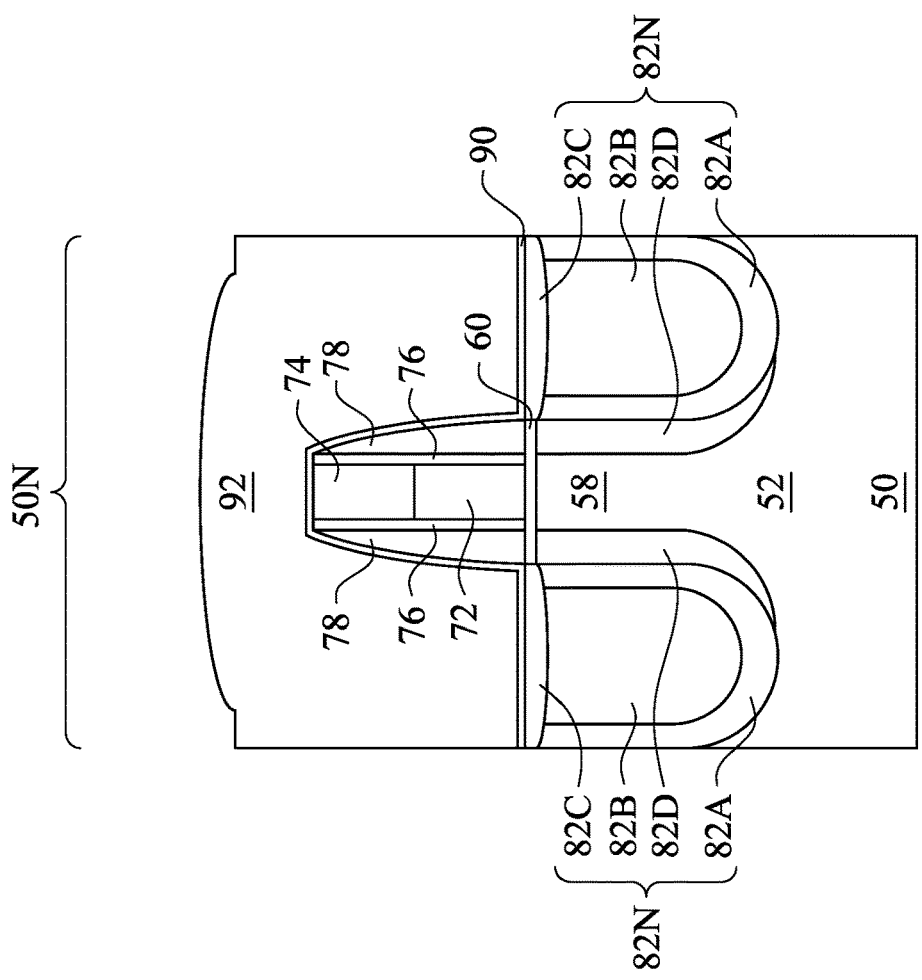

In FIGS. 19A and 19B, an inter-layer dielectric (ILD) 92 is deposited over the structure illustrated in FIGS. 18A and 18B. The ILD 92 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 90 is disposed between the ILD 92 and the source/drain regions 82N and 82P, the masks 74, the gate spacers 78, and the isolation regions 56. The CESL 90 may comprise a dielectric material, such as, silicon nitride, silicon oxide, silicon oxynitride, a combination thereof, or the like, having a different etch rate than the material of the overlying ILD 92.

Figure 20A:
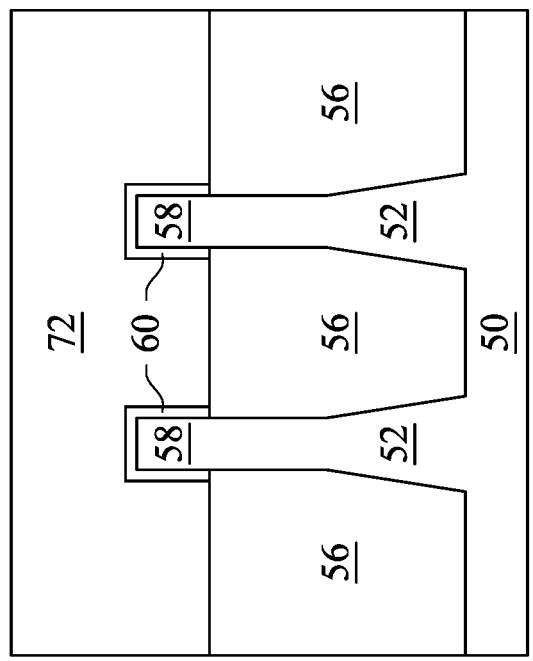
Figure 20B:
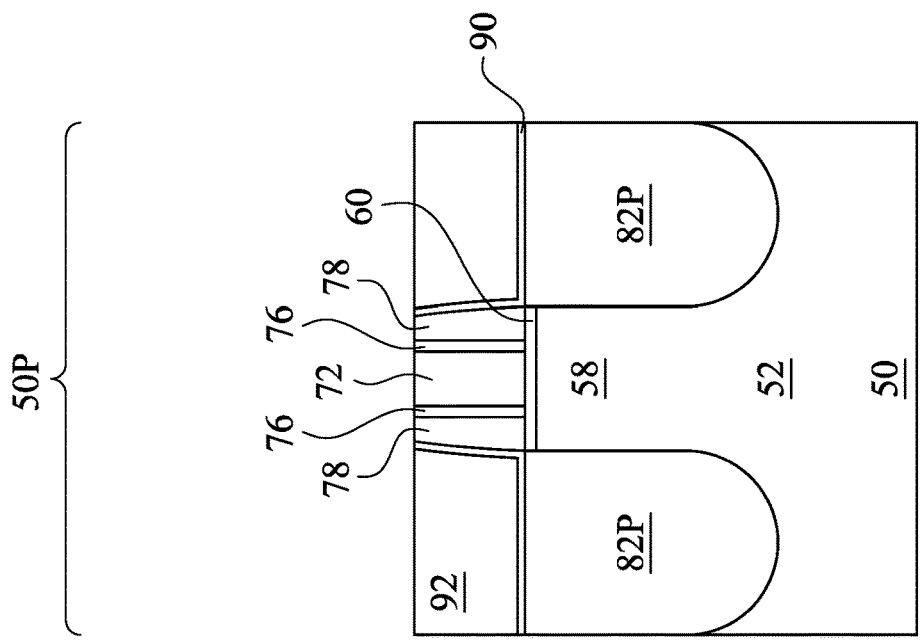
Figure 20B:
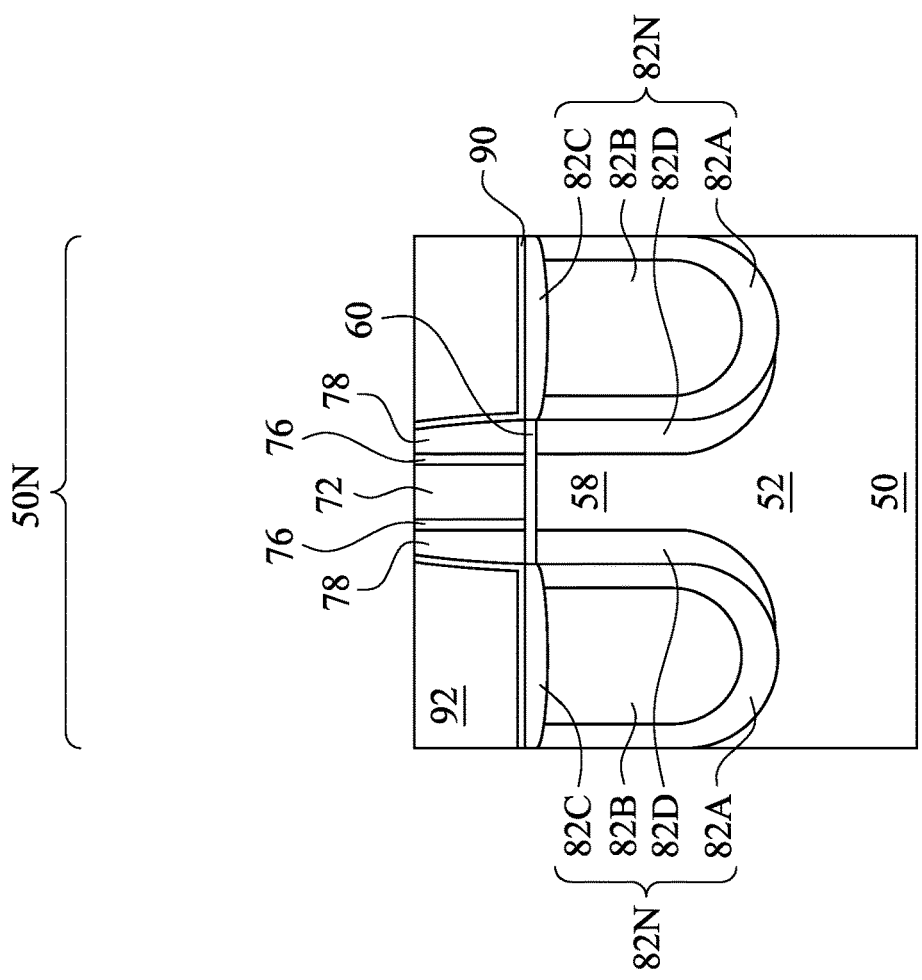

In FIGS. 20A and 20B, a planarization process, such as a CMP process, may be performed to level the top surface of the ILD 92 with the top surfaces of the dummy gates 72, or the masks 74 (see FIGS. 19A and 19B). In some embodiments, the planarization process may also remove the masks 74 on the dummy gates 72, and portions of the gate seal spacers 76 and the gate spacers 78 along sidewalls of the masks 74. After the planarization process, top surfaces of the dummy gates 72, top surfaces of the gate seal spacers 76, top surfaces of the gate spacers 78, and a top surface of the ILD 92 are substantially co-planar or level with each other within process variations of the planarization process. Accordingly, the top surfaces of the dummy gates 72 are exposed through the ILD 92. In some embodiments, the masks 74 may remain, in which case the planarization process levels the top surface of the ILD 92 with top surfaces of the masks 74.

Figure 21A:
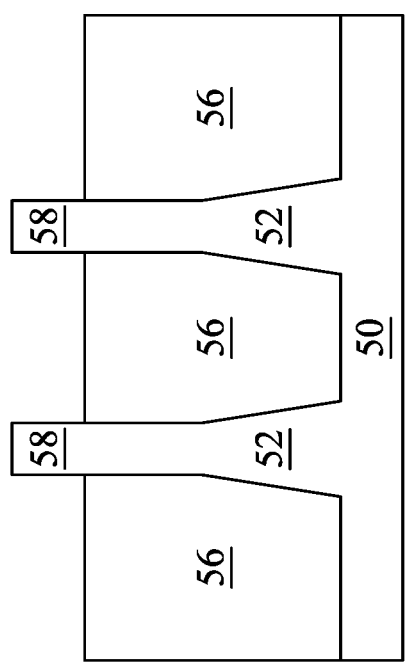
Figure 21B:
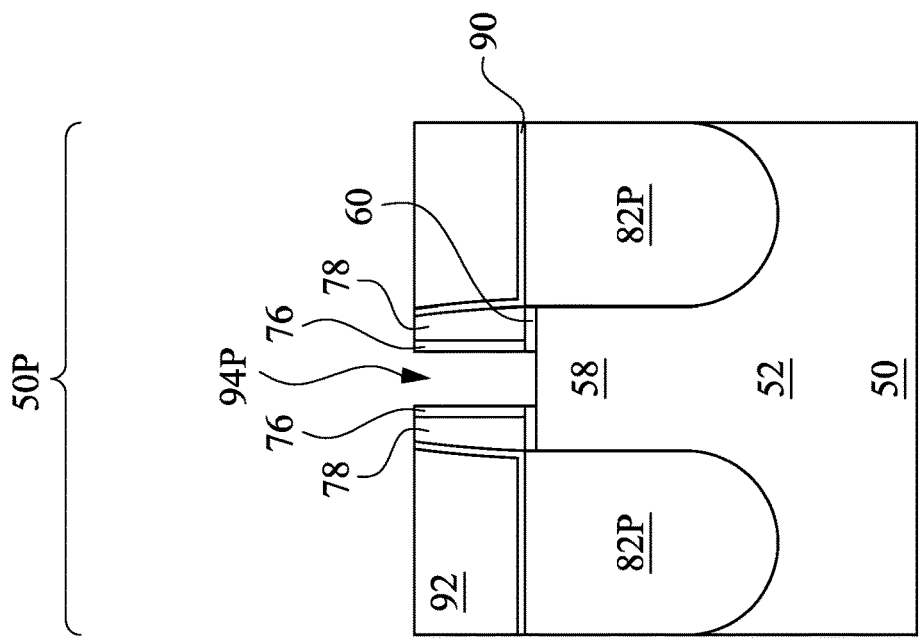
Figure 21B:
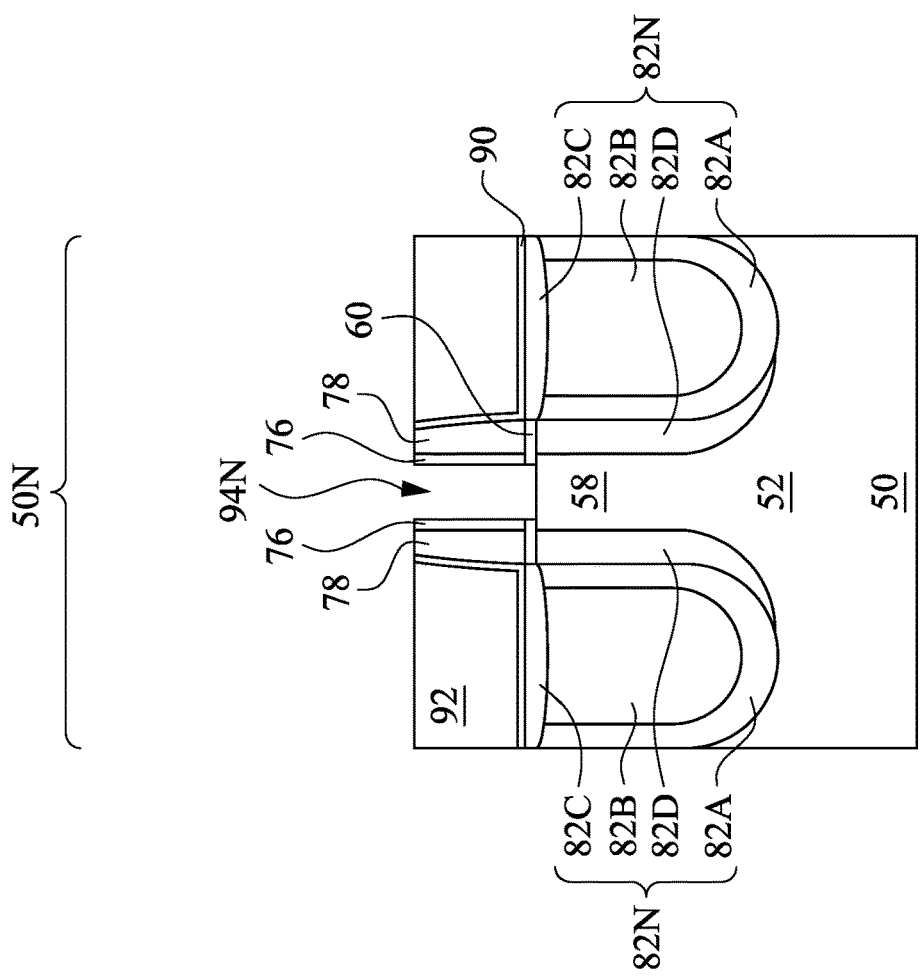

In FIGS. 21A and 21B, the dummy gates 72 (see FIGS. 20A and 20B), and the masks 74 (see FIGS. 19A and 19B), if present, are removed in an etching step(s), so that openings 94N and 94P are formed in the region 50N and the region 50P, respectively. In some embodiments, portions of the dummy dielectric layer 60 in the openings 94N and 94P may also be removed. In other embodiments, only the dummy gates 72 are removed and the dummy dielectric layer 60 remains and is exposed by the openings 94N and 94P. In some embodiments, the dummy dielectric layer 60 is removed from the openings 94N and 94P in a first region of a die (e.g., a core logic region) and remains in openings 94N and 94P in a second region of the die (e.g., an input/output region).

In some embodiments, the dummy gates 72 are removed by a suitable etch process. For example, the etch process may include a dry etch process using reaction gas(es) that selectively etch the dummy gates 72 without etching the ILD 92, the CESL 90, the gate seal spacers 76, and the gate spacers 78. Each of the openings 94N and 94P exposes the channel region 58 of the respective fin 52. During the removal, the dummy dielectric layer 60 may be used as an etch stop layer when the dummy gates 72 are etched. The dummy dielectric layer 60 may then be optionally removed after the removal of the dummy gates 72.

Figure 22A:
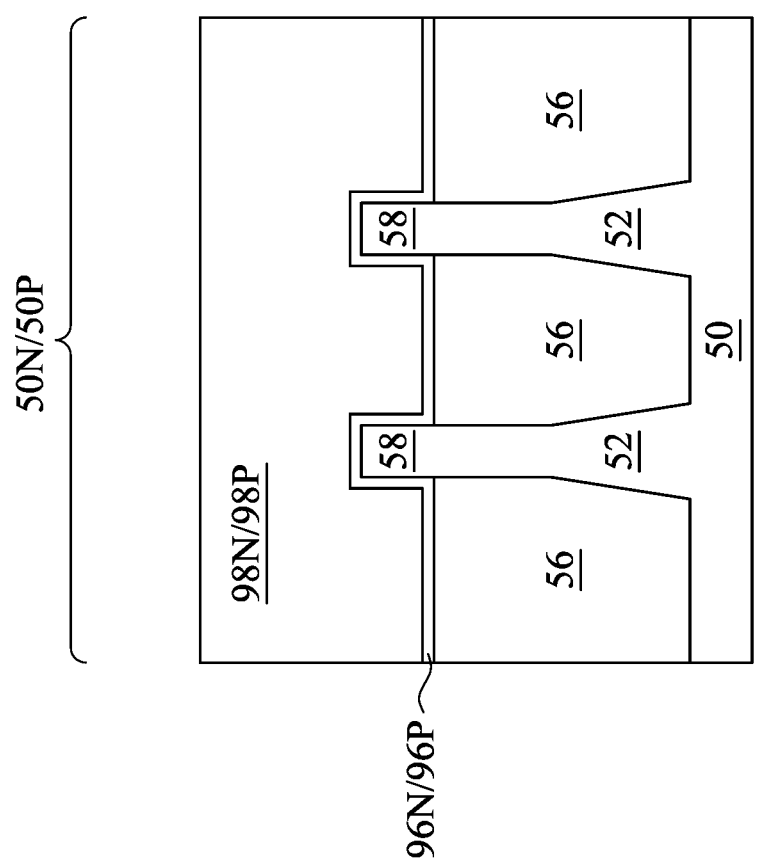
Figure 22B:
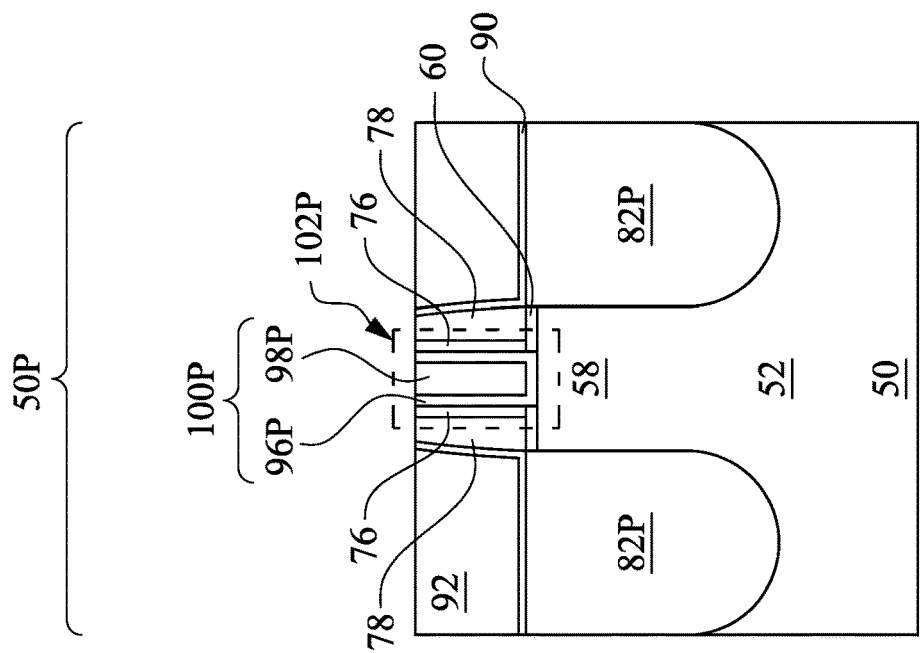
Figure 22B:
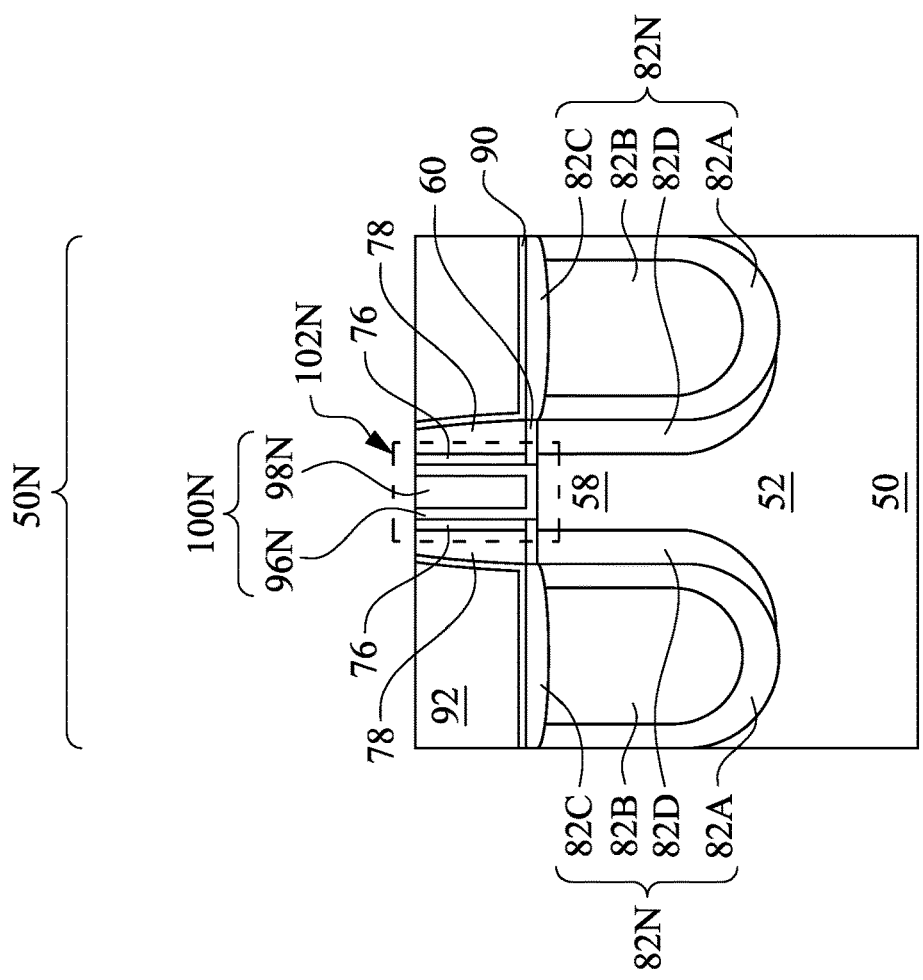
Figure 22C:
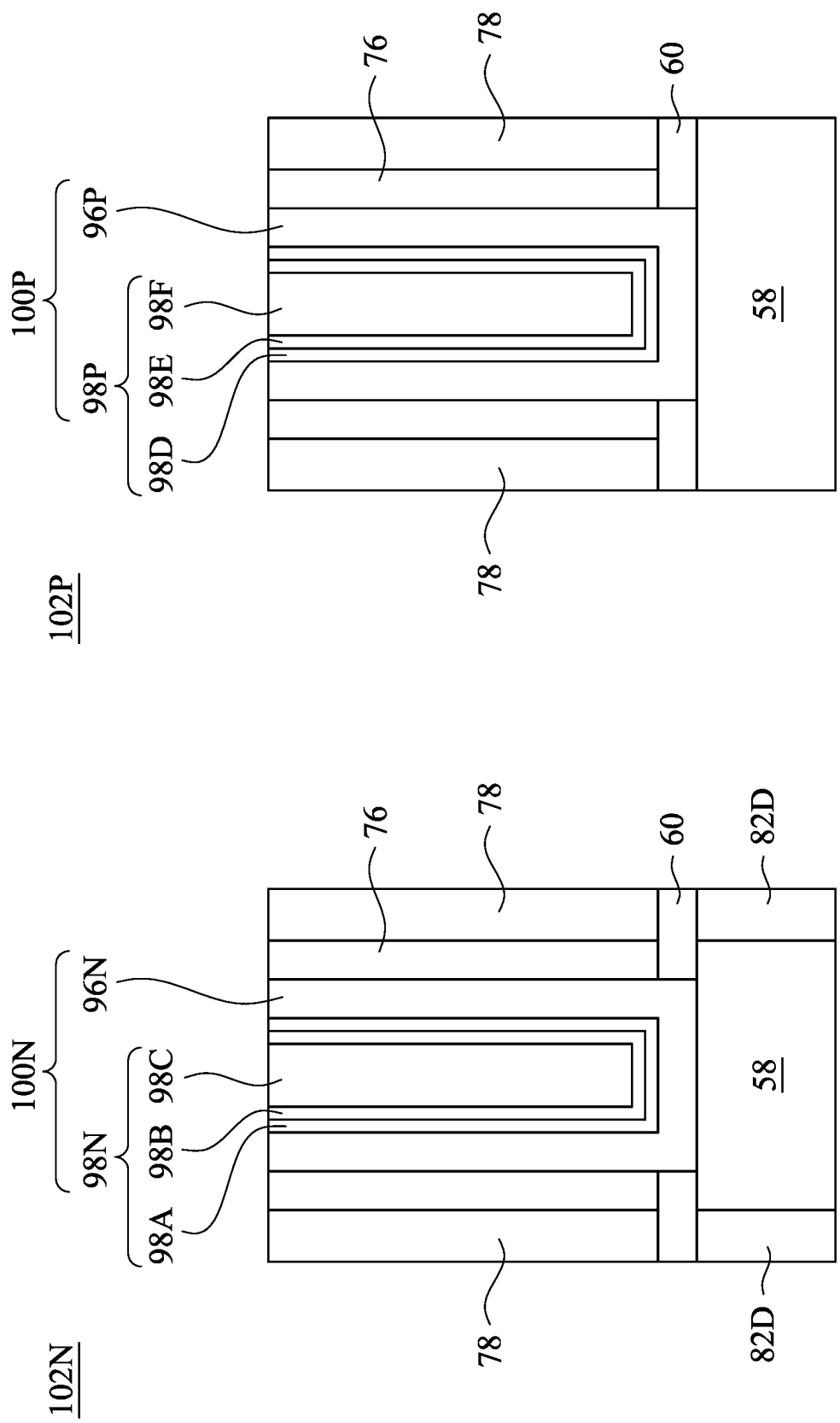

In FIGS. 22A and 22B, a gate stack 100N and a gate stack 100P are formed in the opening 94N and the opening 94P (see FIGS. 21A and 21B), respectively. FIG. 22C illustrates a detailed view of a region 102N and a region 102P of FIG. 17B. The gate stacks 100N and 100P may also be referred as replacement gate stacks. The gate stack 100N comprises a gate dielectric layer 96N and a gate electrode 98N over the gate dielectric layer 96N. The gate stack 100P comprises a gate dielectric layer 96P and a gate electrode 98P over the gate dielectric layer 96P. In some embodiments, gate dielectric layers 96N and 96P are conformally deposited in the openings 94N and 94P, respectfully, such as on the top surfaces and the sidewalls of the fins 52 and on sidewalls of the gate seal spacers 76/gate spacers 78. The gate dielectric layers 96N and 96P may also be formed on the top surface of the ILD 92 in the region 50N and the region 50P, respectively.

In some embodiments, the gate dielectric layers 96N and 96P comprise silicon oxide, silicon nitride, or multilayers thereof. In some embodiments, the gate dielectric layers 96N and 96P include a high-k dielectric material, and in these embodiments, the gate dielectric layers 96N and 96P may have a k value greater than about 7.0, and may include a metal oxide or a silicate of hafnium, aluminum, zirconium, lanthanum, manganese, barium, titanium, lead, and combinations thereof. The formation methods of the gate dielectric layers 96N and 96P may include Molecular-Beam Deposition (MBD), ALD, PECVD, a combination thereof, or the like. In embodiments where portions of the dummy dielectric layer 60 remain in the openings 94N and 94P, the gate dielectric layers 96N and 96P include a material of the dummy dielectric layer 60 (e.g., silicon oxide). In some embodiments, the gate dielectric layer 96N and the gate dielectric layer 96P may comprise a same material and may be formed using a single deposition process. In other embodiments, the gate dielectric layer 96N and the gate dielectric layer 96P may comprise different materials and may be formed using different deposition processes. Various masking steps may be used to mask and expose appropriate regions when using different deposition processes.

The gate electrodes 98N and 98P are deposited over the gate dielectric layers 96N and 96P, and fill the remaining portions of the openings 94N and 94P (see FIGS. 21A and 21B), respectively. Although a single layer gate electrode 98N and a single layer gate electrode 98P are illustrated in FIGS. 22A and 22B, the gate electrodes 98N and 98P may comprise a plurality of layers as illustrated in FIG. 22C.

Referring to FIG. 22C, in some embodiments, the gate electrode 98N comprises one or more liner layers 98A, one or more work function tuning layers 98B, and a conductive fill layer 98C. The one or more liner layers 98A may include TiN, TiO, TaN, TaC, combinations thereof, multi-layers thereof, or the like, and may be formed using PVD, CVD, ALD, a combination thereof, or the like. The one or more work function tuning layers 98B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. The conductive fill layer 98C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

Referring further to FIG. 22C, in some embodiments, the gate electrode 98P comprises one or more liner layers 98D, one or more work function tuning layers 98E, and a conductive fill layer 98F. The one or more liner layers 98D may include TiN, TiO, TaN, TaC, combinations thereof, multi-layers thereof, or the like, and may be formed using PVD, CVD, ALD, a combination thereof, or the like. The one or more work function tuning layers 98E may include TiN, WN, TaN, Ru, Co, combinations thereof, multi-layers thereof, or the like, and may be formed using PVD, CVD, ALD, a combination thereof, or the like. The conductive fill layer 98F may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

In some embodiments, the one or more liner layers 98A and the one or more liner layers 98D may comprise a same material and may be formed using a single deposition process. In other embodiments, the one or more liner layers 98A and the one or more liner layers 98D may comprise different materials and may be formed using different deposition processes. Various masking steps may be used to mask and expose appropriate regions when using different deposition processes.

In some embodiments, the conductive fill layer 98C and the conductive fill layer 98F may comprise a same material and may be formed using a single deposition process. In other embodiments, the conductive fill layer 98C and the conductive fill layer 98F may comprise different materials and may be formed using different deposition processes. Various masking steps may be used to mask and expose appropriate regions when using different deposition processes.

Further in FIGS. 22A, 22B, and 22C, after filling the openings 94N and 94P (see FIGS. 21A and 21B) with conductive fill layers 98C and 98F, respectively, a planarization process, such as a CMP, may be performed to remove the excess portions of the gate dielectric layers 96N and 96P, and the excess portions of the gate electrodes 98N and 98P, which excess portions are over the top surface of the ILD 92. The remaining portions of the gate electrode 98N and the gate dielectric layer 96N thus form the gate stack 100N of the resulting FinFET device in the region 50N. The remaining portions of the gate electrode 98P and the gate dielectric layer 96P thus form the gate stack 100P of the resulting FinFET device in the region 50P. After the planarization process, top surfaces of the gate stacks 100N and 100P, the top surfaces of the gate seal spacers 76, the top surfaces of the gate spacers 78, and the top surface of the ILD 92 are substantially co-planar or level with each other within process variations of the planarization process.

Figure 23A:
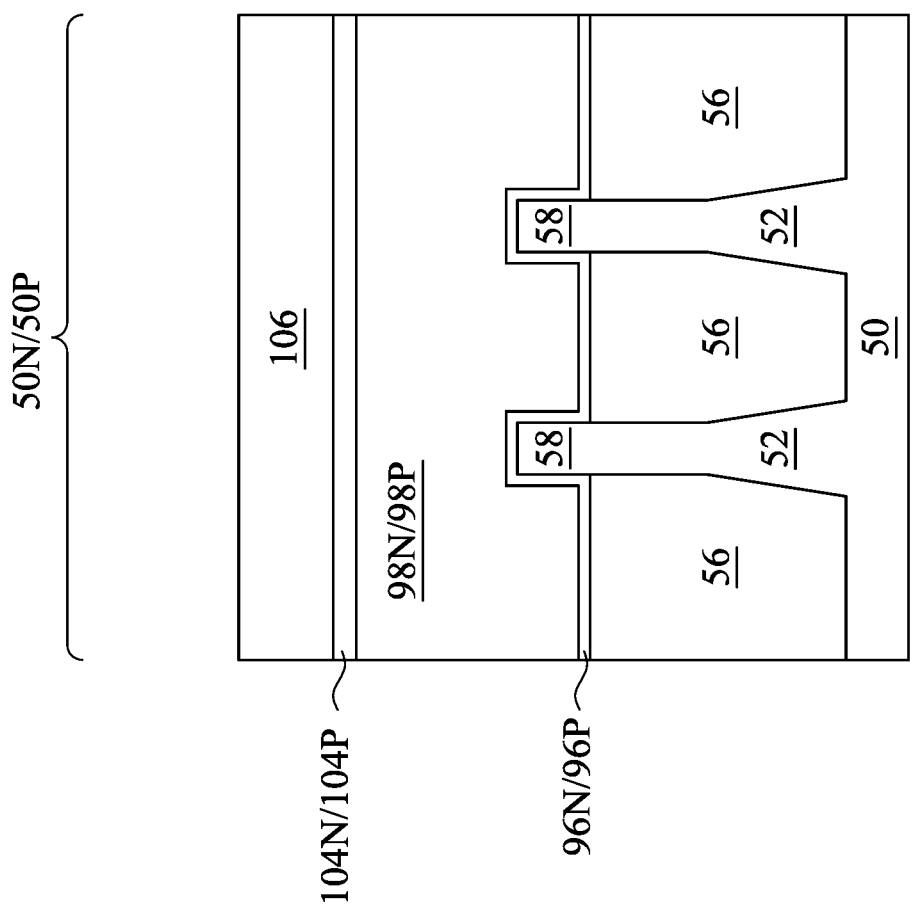
Figure 23B:
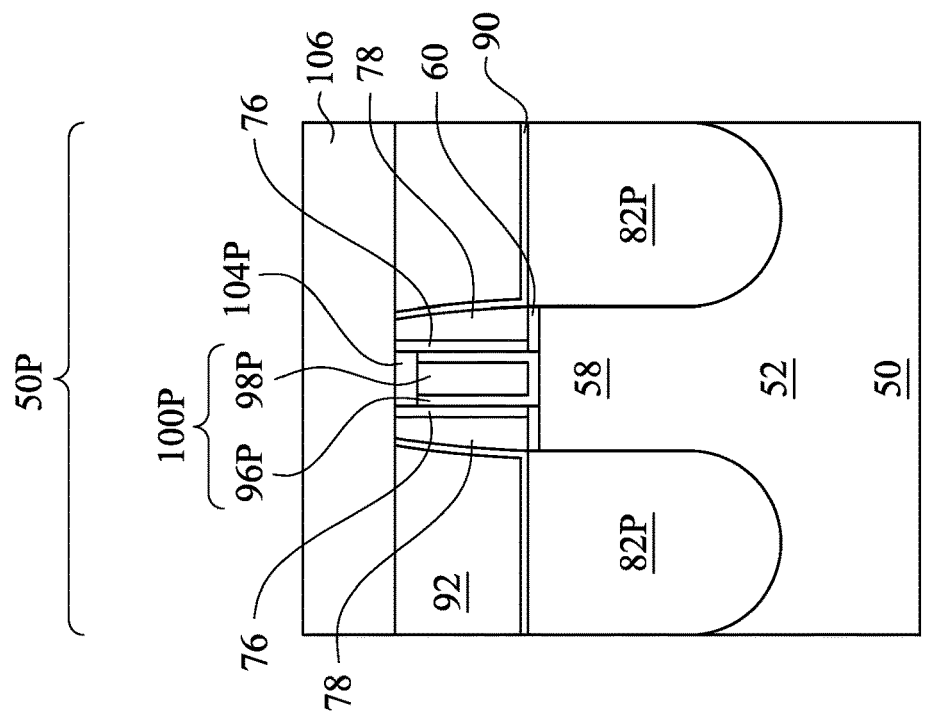
Figure 23B:
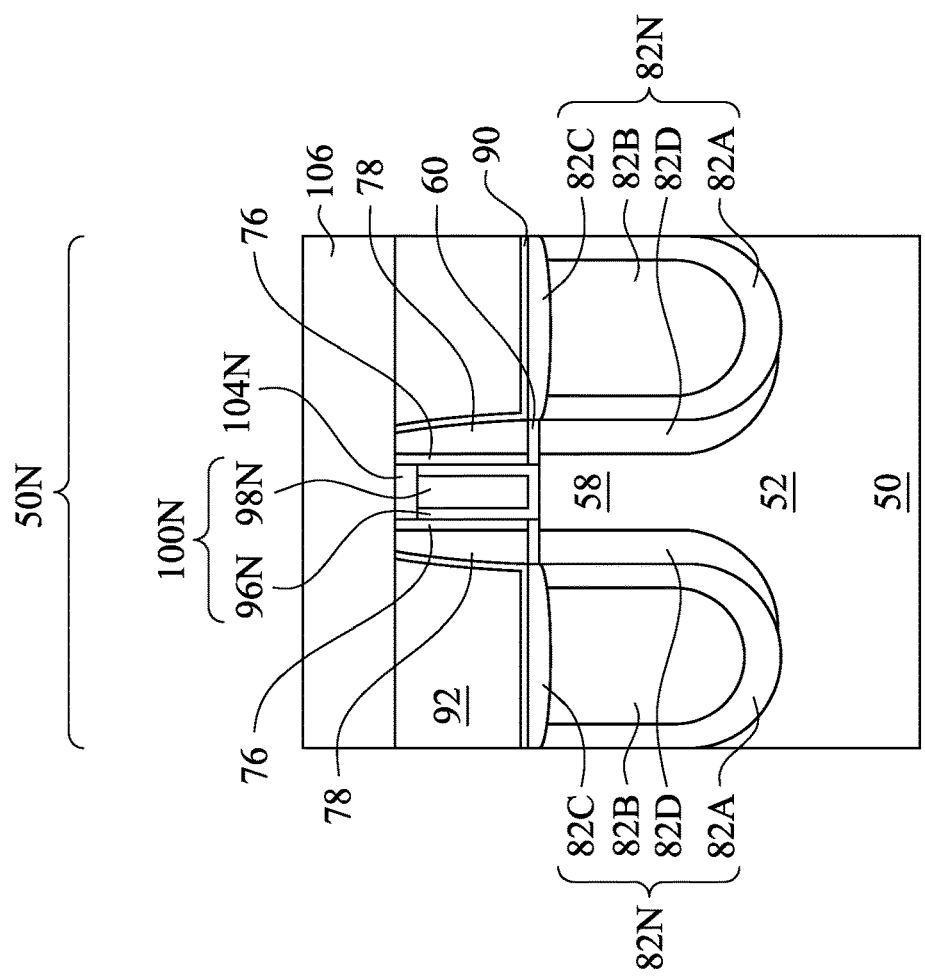

In FIGS. 23A and 23B, after forming the gate stacks 100N and 100P, the gate stacks 100N and 100P are recessed and gate masks 104N and 104P, respectively, are formed in the recesses. The gate masks 104N and 104P may comprise one or more layers of a dielectric material, such as silicon nitride, silicon oxynitride, a combination thereof, or the like, and may be formed using CVD, ALD, a combination thereof, or the like. In some embodiments, dielectric materials of the gate masks 104N and 104P are filled in the recesses followed by a planarization process (such as, for example, a CMP process) to remove excess portions of the dielectric materials extending over the ILD 92. In some embodiments, the gate mask 104N and the gate mask 104P comprise a same material. In other embodiments, the gate mask 104N and the gate mask 104P comprise different materials. After the planarization process, top surfaces of the gate masks 104N and 104P, the top surfaces of the gate seal spacers 76, the top surfaces of the gate spacers 78, and the top surface of the ILD 92 are substantially co-planar or level with each other within process variations of the planarization process.

After forming the gate masks 104N and 104P, an ILD 106 is deposited over the ILD 92 and the gate masks 104N and 104P. In some embodiments, the ILD 106 is formed using similar materials and methods as the ILD 92 described above with reference to FIGS. 19A and 19B, and the description is not repeated herein. In some embodiments, the ILD 92 and the ILD 106 comprise a same material. In other embodiments, the ILD 92 and the ILD 106 comprise different materials.

Figure 24A:
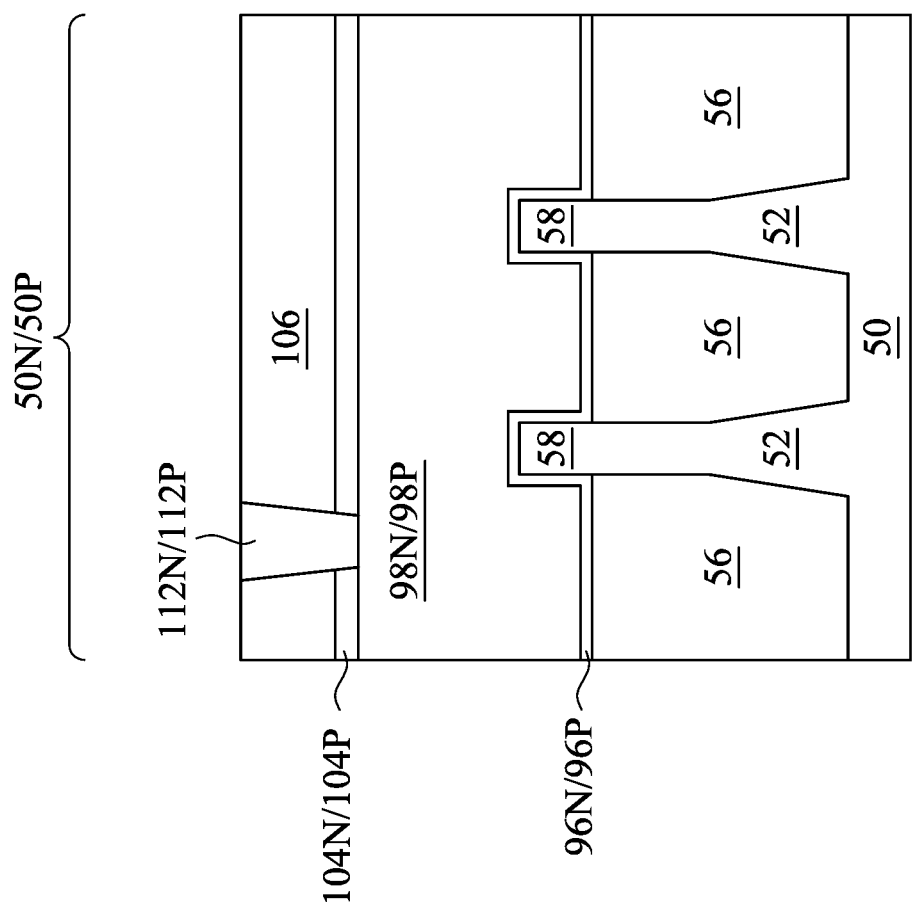
Figure 24B:
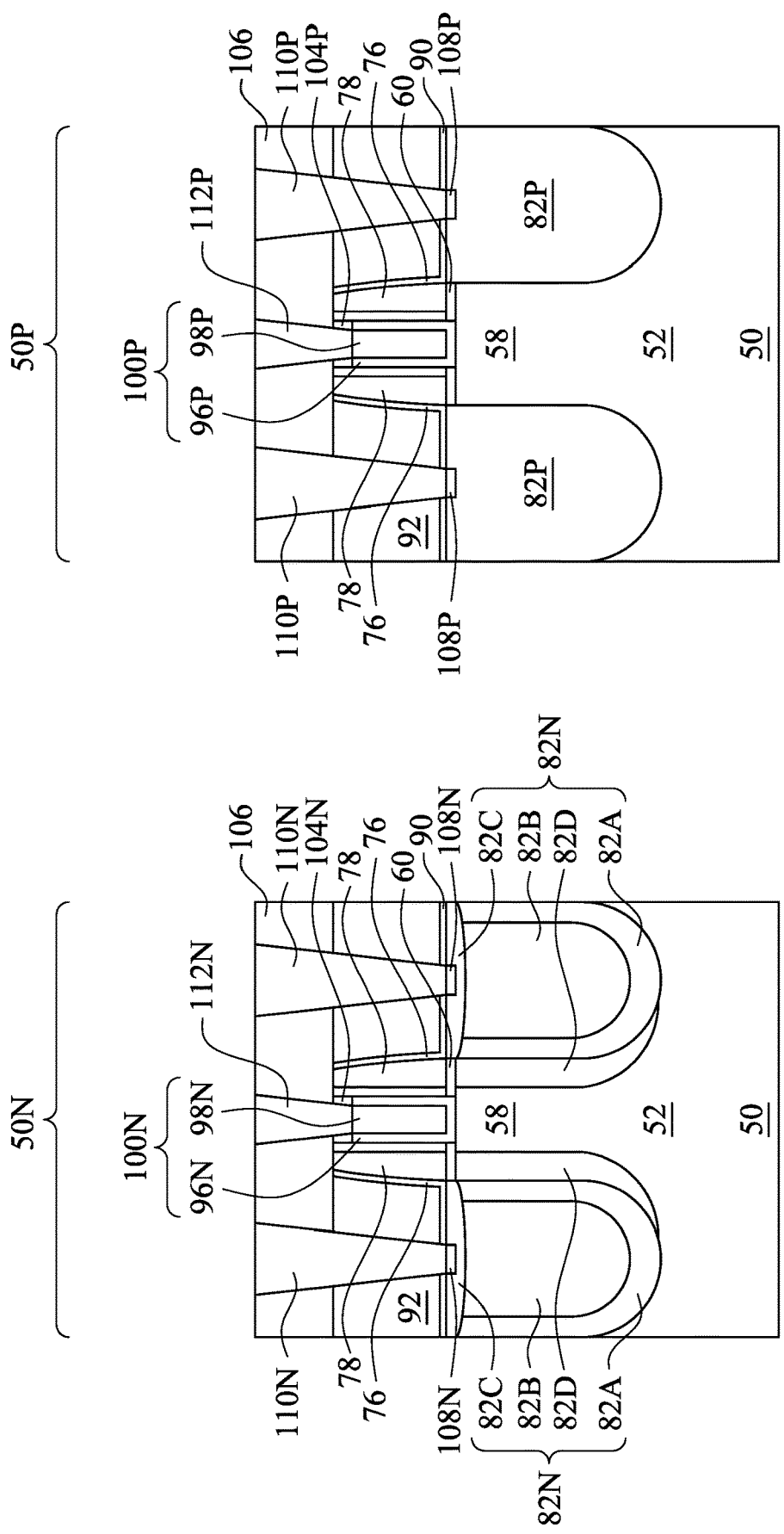

In FIGS. 24A and 24B, source/drain contacts 110N and gate contacts 112N are formed in the region 50N, and source/drain contacts 110P and gate contacts 112P are formed in the region 50P. Openings for the source/drain contacts 110N and 110P are formed through the CESL 90 and the ILDs 92 and 106. Openings for the gate contacts 112N and 112P are formed through the ILD 106 and the gate masks 104N and 104P, respectively. The openings may be formed using acceptable photolithography and etch techniques.

After forming the openings for the source/drain contacts 110N and 110P, silicide layers 108N and 108P are formed through the openings in the regions 50N and 50P, respectively. In some embodiments, a metallic material is deposited in the openings for the source/drain contacts 110N and 110P. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 108N and 108P. In some embodiments, the annealing process causes the metallic material to react with semiconductor materials of the epitaxial source/drain regions 82N and 82P and form the silicide layers 108N and 108P, respectively. After forming the silicide layers 108N and 108P, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 110N and 110P, and in the openings for the gate contacts 112N and 112P. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a top surface of the ILD 106. The remaining portions of the liner and the conductive material form the source/drain contacts 110N and 110P, and the gate contacts 112N and 112P in the respective openings. The source/drain contacts 110N and 110P are electrically coupled to the epitaxial source/drain regions 82N and 82P, respectively. The gate contacts 112N and 112P are electrically coupled to the gate stacks 100N and 100P, respectively.

In some embodiments, the source/drain contacts 110N and the gate contacts 112N in the region 50N comprise a same material as the source/drain contacts 110P and the gate contacts 112P in the region 50P. In other embodiments, the source/drain contacts 110N and the gate contacts 112N in the region 50N comprise a different material than the source/drain contacts 110P and the gate contacts 112P in the region 50P. Although shown as being formed in the same cross-sections, it should be appreciated that each of the source/drain contacts 110N and the gate contacts 112N in the region 50N may be formed in different cross-sections, which may avoid shorting of the contacts. Although shown as being formed in the same cross-sections, it should be appreciated that each of the source/drain contacts 110P and the gate contacts 112P in the regions 50P may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a method includes forming a semiconductor fin extending from a substrate. A dummy gate stack is formed over the semiconductor fin. The dummy gate stack extends along sidewalls and a top surface of the semiconductor fin. The semiconductor fin is patterned to form a recess in the semiconductor fin. A semiconductor material is deposited in the recess. An implantation process is performed on the semiconductor material. The implantation process includes implanting first implants into the semiconductor material and implanting second implants into the semiconductor material. The first implants have a first implantation energy. The second implants have a second implantation energy different from the first implantation energy.

Embodiments may include one or more of the following features. The method where the first implants include arsenic (As), phosphorus (P), or antimony (Sb). The method where the second implants includes arsenic (As), phosphorus (P), or antimony (Sb). The method where the first implantation energy is greater than the second implantation energy. The method where the first implantation energy is less than the second implantation energy. The method where the first implants are different from the second implants. The method where the first implants are same as the second implants.

In accordance with another embodiment, a method includes forming a semiconductor fin extending from a substrate. A dummy gate stack is formed over the semiconductor fin. The dummy gate stack overlaps the semiconductor fin in a plan view. The semiconductor fin is etched to form a recess in the semiconductor fin. A semiconductor material is epitaxially grown in the recess. A first implantation process is performed on the semiconductor material. The first implantation process implants first implants into the semiconductor material. After performing the first implantation process, a second implantation process is performed on the semiconductor material. The second implantation process implants second implants into the semiconductor material. After performing the second implantation process, an anneal process is performed on the semiconductor material. The anneal process forms a doped region in the semiconductor fin at an interface between the semiconductor material and the semiconductor fin.

Embodiments may include one or more of the following features. The method further including, after performing the second implantation process and before performing the anneal process, performing a third implantation process on the semiconductor material, the third implantation process implanting third implants into the semiconductor material. The method where the first implantation process is performed with a first implantation energy, where the second implantation process is performed with a second implantation energy different from the first implantation energy, and where the third implantation process is performed with a third implantation energy different from the first implantation energy or the second implantation energy. The method where the third implants are different from the first implants or the second implants. The method where the first implants and the second implants are n-type implants. The method where the first implants are different from the second implants. The method where the semiconductor material and the doped region extend into the semiconductor fin to a same depth.

In accordance with yet another embodiment, a device includes a semiconductor fin extending from a substrate, a gate stack extending along sidewalls and a top surface of the semiconductor fin, and a source/drain region extending into the semiconductor fin adjacent to the gate stack. The source/drain region includes a first region in an interior of the source/drain region, a second region surrounding the first region, and a third region surrounding the second region. The first region has a first dopant concentration. The second region has a second dopant concentration less than the first dopant concentration. The third region has a third dopant concentration less than the second dopant concentration.

Embodiments may include one or more of the following features. The device where dopants of the source/drain region comprise arsenic (As), phosphorus (P), or antimony (Sb). The device where the source/drain region further includes a fourth region surrounding the third region, the fourth region having a fourth dopant concentration less than the third dopant concentration. The device wherein the source/drain region further includes an epitaxial semiconductor material expending into the semiconductor fin to a first depth, and a doped region of the semiconductor fin, the doped region of the semiconductor fin being disposed at a first interface between the epitaxial semiconductor material and the of the semiconductor fin. The device where the doped region of the semiconductor fin extends along the first interface to the first depth. The device further includes a pn junction at a second interface between the doped region of the semiconductor fin and a channel region of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin extending from a substrate;
   forming a dummy gate stack over the semiconductor fin, the dummy gate stack extending along sidewalls and a top surface of the semiconductor fin;
   patterning the semiconductor fin to form a recess in the semiconductor fin;
   depositing a semiconductor material in the recess;

performing an implantation process on the semiconductor material, wherein performing the implantation process comprises:
   implanting first implants into the semiconductor material, implanting the first implants using a first implantation energy; and
   implanting second implants into the semiconductor material, implanting the second implants using a second implantation energy different from the first implantation energy, wherein the first implants and the second implants are dopants of a same conductivity type, wherein the first implants are same as the second implants;
after performing the implantation process, forming one or more dielectric layers over the semiconductor material; and
forming a contact through the one or more dielectric layers to the semiconductor material.

2. The method of claim 1, wherein the first implants comprise arsenic (As), phosphorus (P), or antimony (Sb).

3. The method of claim 1, wherein the second implants comprise arsenic (As), phosphorus (P), or antimony (Sb).

4. The method of claim 1, wherein the first implantation energy is greater than the second implantation energy.

5. The method of claim 1, wherein the first implantation energy is less than the second implantation energy.

6. The method of claim 1, further comprising performing an anneal process to form a doped region in the semiconductor fin at an interface between the semiconductor material and the semiconductor fin, the doped region extending continuously from an upper surface of the semiconductor fin toward a bottom of the semiconductor material in the recess.

7. The method of claim 6, wherein the semiconductor material and the doped region extend into the semiconductor fin to a same depth.

8. A method comprising:
   forming a semiconductor fin extending from a substrate;
   forming a dummy gate stack over the semiconductor fin, the dummy gate stack overlapping the semiconductor fin in a plan view;
   etching the semiconductor fin to form a recess in the semiconductor fin;
   epitaxially growing a semiconductor material in the recess;
   performing a first implantation process on the semiconductor material, the first implantation process implanting first implants into the semiconductor material;
   after performing the first implantation process, performing a second implantation process on the semiconductor material, the second implantation process implanting second implants into the semiconductor material; and
   after performing the second implantation process, performing an anneal process on the semiconductor material, the anneal process forming a doped region in the semiconductor fin at an interface between the semiconductor material and the semiconductor fin, wherein the semiconductor material and the doped region extend into the semiconductor fin to a same depth.

9. The method of claim 8, further comprising, after performing the second implantation process and before performing the anneal process, performing a third implantation process on the semiconductor material, the third implantation process implanting third implants into the semiconductor material.

10. The method of claim 9, wherein the first implantation process is performed with a first implantation energy, wherein the second implantation process is performed with a second implantation energy different from the first implantation energy, and wherein the third implantation process is performed with a third implantation energy different from the first implantation energy or the second implantation energy.

11. The method of claim 9, wherein the third implants are different from the first implants or the second implants.

12. The method of claim 8, wherein the first implants and the second implants are n-type implants.

13. The method of claim 8, wherein the first implants are different from the second implants.

14. A method comprising:
   forming a recess in a first semiconductor material;
   forming a second semiconductor material in the recess;
   performing a first implantation process on the second semiconductor material, wherein performing the first implantation process comprises implanting first dopants using a first implantation energy;
   performing a second implantation process on the second semiconductor material, wherein performing the second implantation process comprises implanting the first dopants using a second implantation energy different from the first implantation energy; and
   after performing the first implantation process and the second implantation process, performing an anneal process, the anneal process driving at least some of the first dopants from the first implantation process and at least some of the first dopants from the second implantation process into the first semiconductor material, wherein the first dopants implanted in the first implantation process and the first dopants implanted in the second implantation process are dopants of a same conductivity type.

15. The method of claim 14, wherein the first implantation energy is greater than the second implantation energy.

16. The method of claim 14, wherein the first implantation energy is less than the second implantation energy.

17. The method of claim 14, further comprising:
   performing a third implantation process on the second semiconductor material, wherein performing the third implantation process comprises implanting second dopants.

18. The method of claim 17, wherein the second dopants are the same as the first dopants.

19. The method of claim 17, wherein the second dopants are different than the first dopants.

20. The method of claim 14, wherein the second semiconductor material and the first dopants extend into the first semiconductor material to a same depth.

* * * * *